US012581657B2

(12) United States Patent
Kwon et al.

(10) Patent No.: US 12,581,657 B2
(45) Date of Patent: Mar. 17, 2026

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Donghoon Kwon, Hwaseong-si (KR); Boun Yoon, Seoul (KR); Kihoon Jang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 671 days.

(21) Appl. No.: 18/047,376

(22) Filed: Oct. 18, 2022

(65) Prior Publication Data

US 2023/0255031 A1      Aug. 10, 2023

(30) Foreign Application Priority Data

Feb. 4, 2022      (KR) ........................ 10-2022-0014981

(51) Int. Cl.
  *H10B 43/40*        (2023.01)
  *H01L 23/522*       (2006.01)
          (Continued)
(52) U.S. Cl.
  CPC ......... *H10B 43/40* (2023.02); *H01L 23/5226* (2013.01); *H01L 23/5283* (2013.01);
          (Continued)
(58) Field of Classification Search
  CPC ........ H10B 43/40; H10B 41/10; H10B 41/35; H10B 41/40; H10B 43/10; H10B 43/27;
          (Continued)

(56) References Cited

U.S. PATENT DOCUMENTS 7,037,835 B2      5/2006   Lee et al.
7,550,822 B2      6/2009   Lee et al.
          (Continued)

FOREIGN PATENT DOCUMENTS

KR          102239602 B1      4/2021

OTHER PUBLICATIONS

Extended European Search Report corresponding to EP 22213848. 9; Dated Sep. 15, 2023 (12 pages).

*Primary Examiner* — Galina G Yushina
(74) *Attorney, Agent, or Firm* — Wolf, Greenfield & Sacks, P.C.

(57)          ABSTRACT

A semiconductor device includes a peripheral circuit structure including a substrate, a circuit element on the substrate, connection patterns electrically connected to the circuit element, and a peripheral insulating structure on the circuit element, a memory cell structure on the peripheral circuit structure, the memory cell structure including interlayer insulating layers and gate electrodes alternately stacked on each other, an upper wiring, and a through-contact plug electrically connecting the upper wiring to an upper connection pattern in, which is in an uppermost position of the connection patterns relative to an upper surface of the substrate providing a base reference surface, wherein the peripheral circuit structure further includes a dam structure on the upper connection pattern, the peripheral insulating structure includes a first insulating layer on the circuit element and a side surface of the upper connection pattern and a second insulating layer, a capping layer, and a third insulating layer sequentially stacked on the first insulating layer, wherein the dam structure passes through the second insulating layer and contacts the upper connection pattern, and wherein the through-contact plug includes a lower portion passing through the dam structure and contacting the (Continued)

100c

236 { 236b, 236a }
235
234
233
INT3 { PL, BM }

174-1 } 174 (174a)
174-2
240
INT3_UE
240_LE
174_LE
PL } INT3
BM

240P   INT_I   INT_V

A upper connection pattern and an upper portion on the lower portion.

20 Claims, 21 Drawing Sheets

(51) Int. Cl.

| | | |
|---|---|---|
| *H01L 23/528* | (2006.01) | |
| *H10B 41/10* | (2023.01) | |
| *H10B 41/27* | (2023.01) | |
| *H10B 41/35* | (2023.01) | |
| *H10B 41/40* | (2023.01) | |
| *H10B 43/10* | (2023.01) | |
| *H10B 43/27* | (2023.01) | |
| *H10B 43/35* | (2023.01) | |

(52) U.S. Cl.

CPC ............. *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02)

(58) Field of Classification Search

CPC ........ H10B 43/35; H10B 41/30; H10B 41/50; H10B 43/50; H01L 23/5226; H01L 23/5283

See application file for complete search history.

(56) References Cited

U.S. PATENT DOCUMENTS

| | | | | |
|---|---|---|---|---|
| 7,986,040 | B2 | 7/2011 | Bartsch et al. | |
| 9,536,897 | B2 | 1/2017 | Yoo et al. | |
| 10,192,782 | B2 | 1/2019 | Lee et al. | |
| 11,049,872 | B2 | 6/2021 | Nojima et al. | |
| 2016/0163730 | A1* | 6/2016 | Lim ........................ | H10B 43/27 |
| | | | | 257/314 |
| 2017/0236746 | A1* | 8/2017 | Yu .......................... | G11C 16/24 |
| | | | | 257/314 |
| 2017/0352678 | A1* | 12/2017 | Lu ........................ | H01L 21/4846 |
| 2019/0280002 | A1* | 9/2019 | Kai ........................ | H10B 43/10 |
| 2020/0027893 | A1* | 1/2020 | Yang ...................... | H10B 41/50 |
| 2020/0098782 | A1* | 3/2020 | Nojima .................. | H10B 43/27 |
| 2020/0197565 | A1* | 6/2020 | Suh ........................ | A61L 27/28 |
| 2021/0082941 | A1 | 3/2021 | Son et al. | |
| 2021/0175167 | A1* | 6/2021 | Lee ........................ | H10B 43/40 |
| 2021/0265293 | A1* | 8/2021 | Tagami ................. | H01L 25/105 |

* cited by examiner

A

A

A

A

A

<u>A</u>

A

C

<u>C</u>

<u>C</u>

C

C

SEMICONDUCTOR DEVICES AND DATA STORAGE SYSTEMS INCLUDING THE SAME

CROSS-REFERENCE TO RELATED APPLICATION(S)

This application claims the benefit under 35 USC 119(a) of Korean Patent Application No. 10-2022-0014981 filed on Feb. 4, 2022 in the Korean Intellectual Property Office, the entire disclosure of which is incorporated herein by reference for all purposes.

BACKGROUND

The present inventive concept relates to semiconductor devices and data storage systems including the same.

In a data storage system involving data storage, a semiconductor device capable of storing high-capacity data is required. Accordingly, methods for increasing data storage capacity of semiconductor devices have been studied. For example, one approach for increasing data storage capacity of a semiconductor devices may include arranging the memory cells in the semiconductor device three-dimensionally instead of two-dimensionally.

SUMMARY

Example embodiments provide a semiconductor device and a data storage system having improved integration and production yield.

According to example embodiments, a semiconductor device includes: a peripheral circuit structure including a substrate, a circuit element on the substrate, a circuit wiring structure including connection patterns electrically connected to the circuit element on the substrate and having different height levels relative to the substrate associated therewith, respectively, and a peripheral insulating structure on the circuit element and the circuit wiring structure on the substrate; a memory cell structure on the peripheral circuit structure, the memory cell structure including interlayer insulating layers and gate electrodes alternately stacked on each other, a channel structure passing through the gate electrodes, and an upper wiring electrically connected to the channel structure on the channel structure; and a through-contact plug electrically connecting either at least one of the gate electrodes or the upper wiring to an upper connection pattern, which is in an uppermost position of the connection patterns relative to the upper surface of the substrate providing a base reference surface, wherein the peripheral circuit structure further includes a dam structure on the upper connection pattern, wherein the peripheral insulating structure includes a first insulating layer on the circuit element and on a side surface of the upper connection pattern, a second insulating layer on the first insulating layer, a capping layer on the second insulating layer, and a third insulating layer on the capping layer, wherein the dam structure passes through at least the second insulating layer and contacts the upper connection pattern, and wherein the through-contact plug includes a lower portion passing through the dam structure and contacts the upper connection pattern and an upper portion on the lower portion.

According to example embodiments, a semiconductor device includes: a peripheral circuit structure including a substrate, a circuit element on the substrate, a circuit wiring structure including connection patterns electrically connected to the circuit element on the substrate and having different height levels, relative to the substrate associated therewith, respectively, and a peripheral insulating structure on the circuit element and the circuit wiring structure on the substrate; a memory cell structure on the peripheral circuit structure, the memory cell structure including interlayer insulating layers and gate electrodes alternately stacked on each other, a channel structure passing through the gate electrodes, and an upper wiring electrically connected to the channel structure on the channel structure; and a through-contact plug electrically connecting an upper connection pattern, which is in an uppermost position of the connection patterns relative to the upper surface of the substrate providing a base reference surface, to either the upper wiring or the gate electrodes, wherein the peripheral insulating structure includes a capping layer on the upper connection pattern and an intermediate insulating layer between the capping layer and the upper connection pattern, wherein the peripheral circuit structure further includes a dam structure passing through at least the intermediate insulating layer, bordering a portion of a side surface of the through-contact plug, and including a material different from a material of the intermediate insulating layer, and wherein the capping layer includes an insulating material different from the material of the intermediate insulating layer.

According to example embodiments, a data storage system includes: a semiconductor storage device including a peripheral circuit structure including a substrate, a circuit element on the substrate, a circuit wiring structure including connection patterns electrically connected to the circuit element on the substrate and having different height levels, relative to the substrate associated therewith respectively, and a peripheral insulating structure on the circuit element and the circuit wiring structure on the substrate, a memory cell structure on the peripheral circuit structure, the memory cell structure including interlayer insulating layers and gate electrodes alternately stacked on each other, a channel structure passing through the gate electrodes, and an upper wiring electrically connected to the channel structure on the channel structure, a through-contact plug electrically connecting an upper connection pattern, which is in an uppermost position of the connection patterns relative to the upper surface of the substrate providing a base reference surface, to either the upper wiring or the gate electrodes, and an input/output pad electrically connected to the circuit element; and a controller electrically connected to the semiconductor storage device through the input/output pad and configured to control the semiconductor storage device, wherein the peripheral insulting structure includes a capping layer on the upper connection pattern and an intermediate insulating layer between the capping layer and the upper connection pattern, wherein the peripheral circuit structure further includes a dam structure passing through at least the intermediate insulating layer, bordering a portion of a side surface of the through-contact plug, and including a material different from a material of the intermediate insulating layer, and wherein the capping layer includes an insulating material different from the material of the intermediate insulating layer.

The above and other aspects, features, and advantages of the present inventive concept will be more clearly understood from the following detailed description, taken in conjunction with the accompanying drawings, in which:

FIGS. 1A, 1B, and 1C are schematic cross-sectional views and a plan view of a semiconductor device according to example embodiments;

DETAILED DESCRIPTION

Figure 1A:
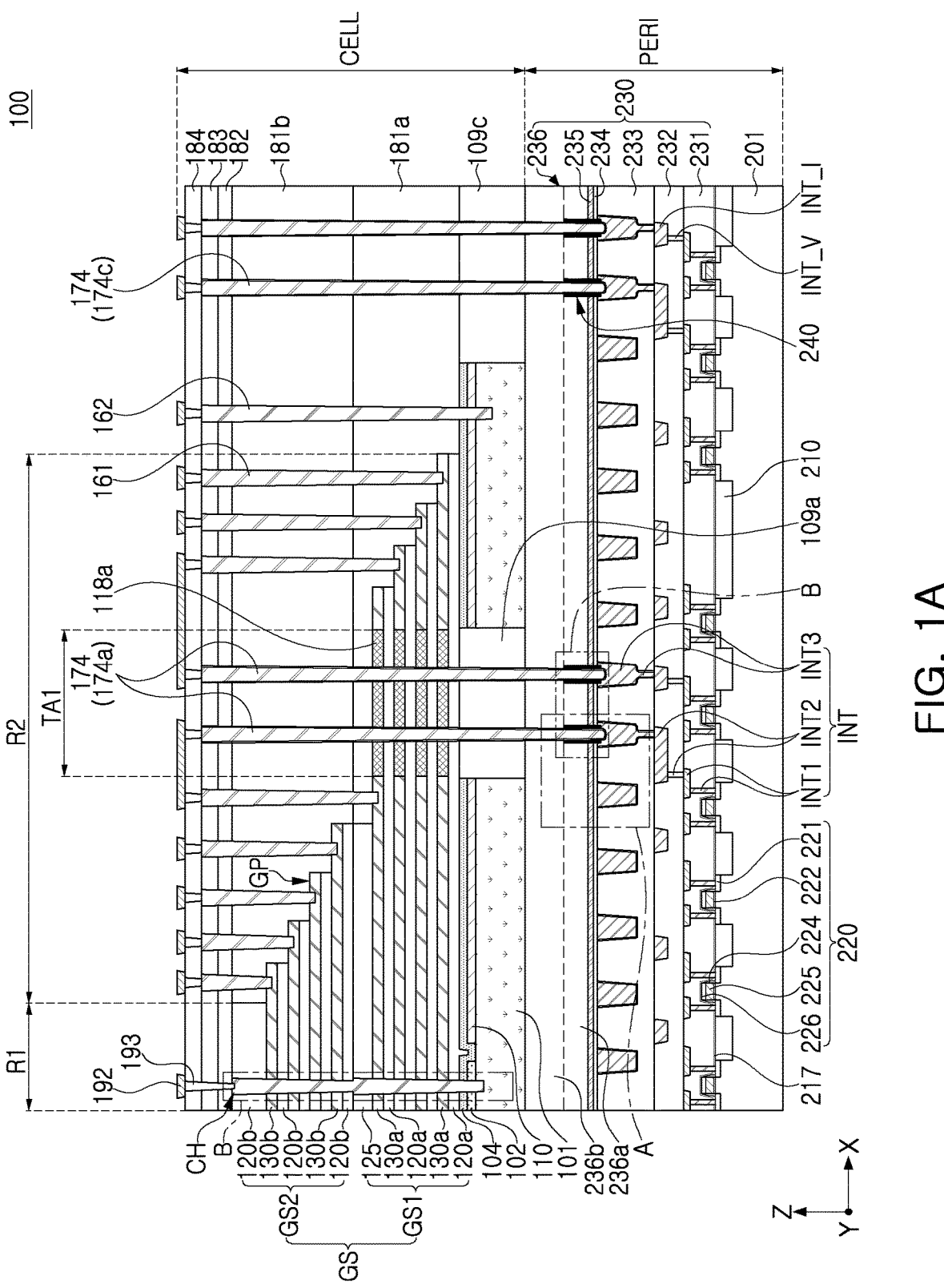

Hereinafter, example embodiments will be described with reference to the accompanying drawings. The present inventive subject matter may, however, be embodied in many different forms and should not be construed as limited to the embodiments set forth herein. In the drawings, like numerals refer to like elements throughout the description and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 1B:
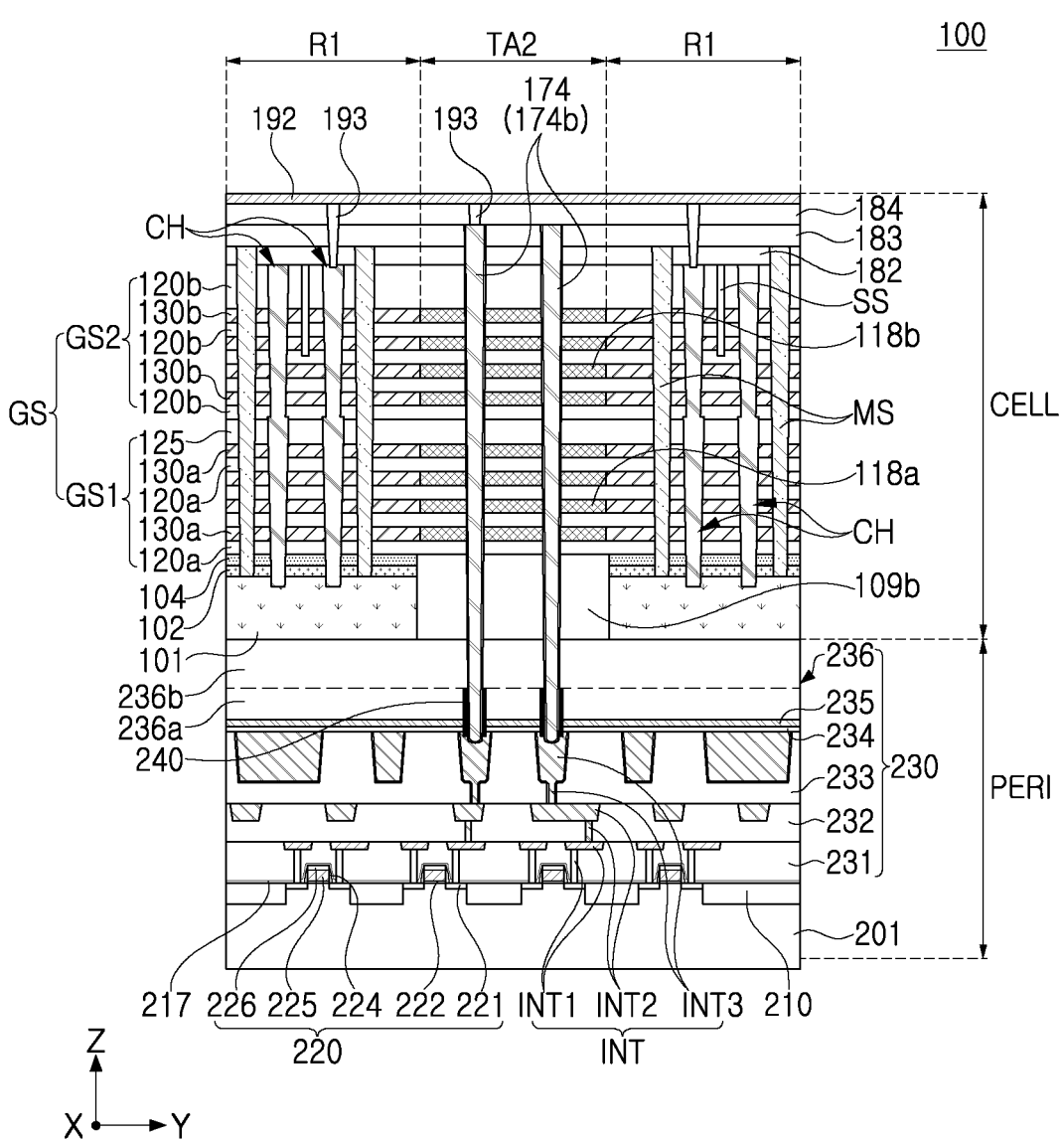
Figure 1C:
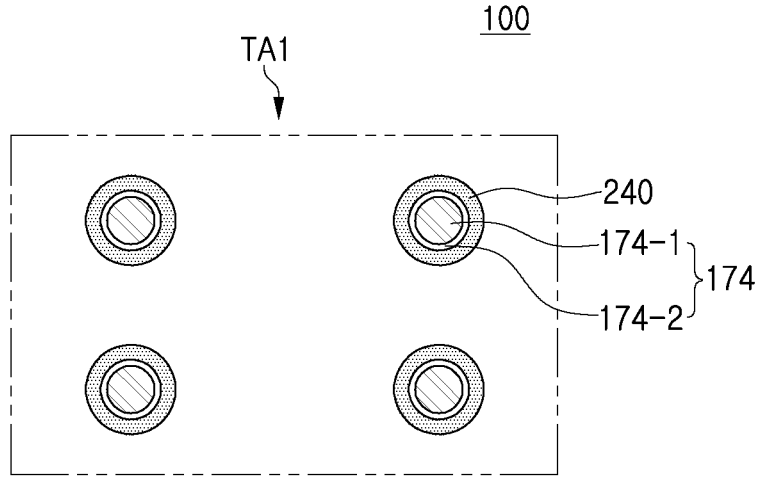
Figure 1C:
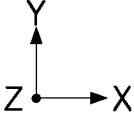

FIGS. 1A and 1B are schematic cross-sectional views of a semiconductor device 100 according to example embodiments. FIG. 1C is a schematic plan view of the semiconductor device 100 according to example embodiments. FIG. 1C is an enlarged plan view of a portion of through-wiring regions of FIG. 1A.

Figure 2:
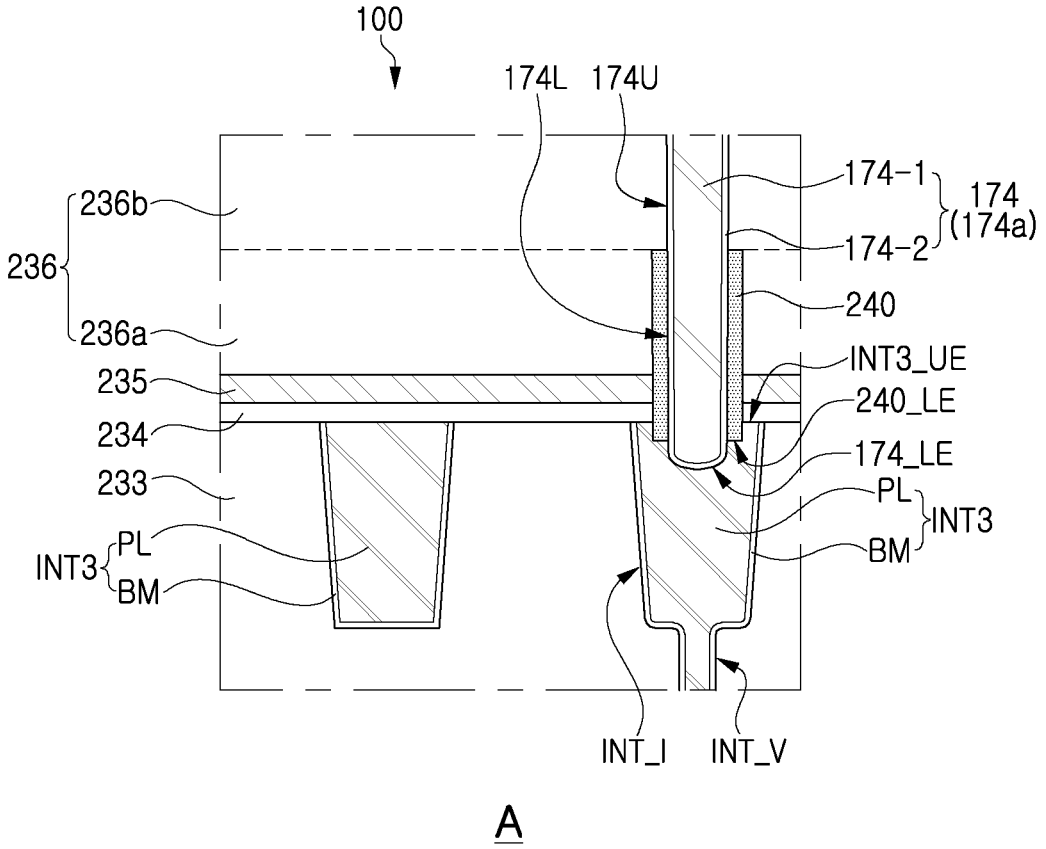
FIGS. 2 and 3 are schematic partially enlarged views of a semiconductor device according to example embodiments.
Figure 3:
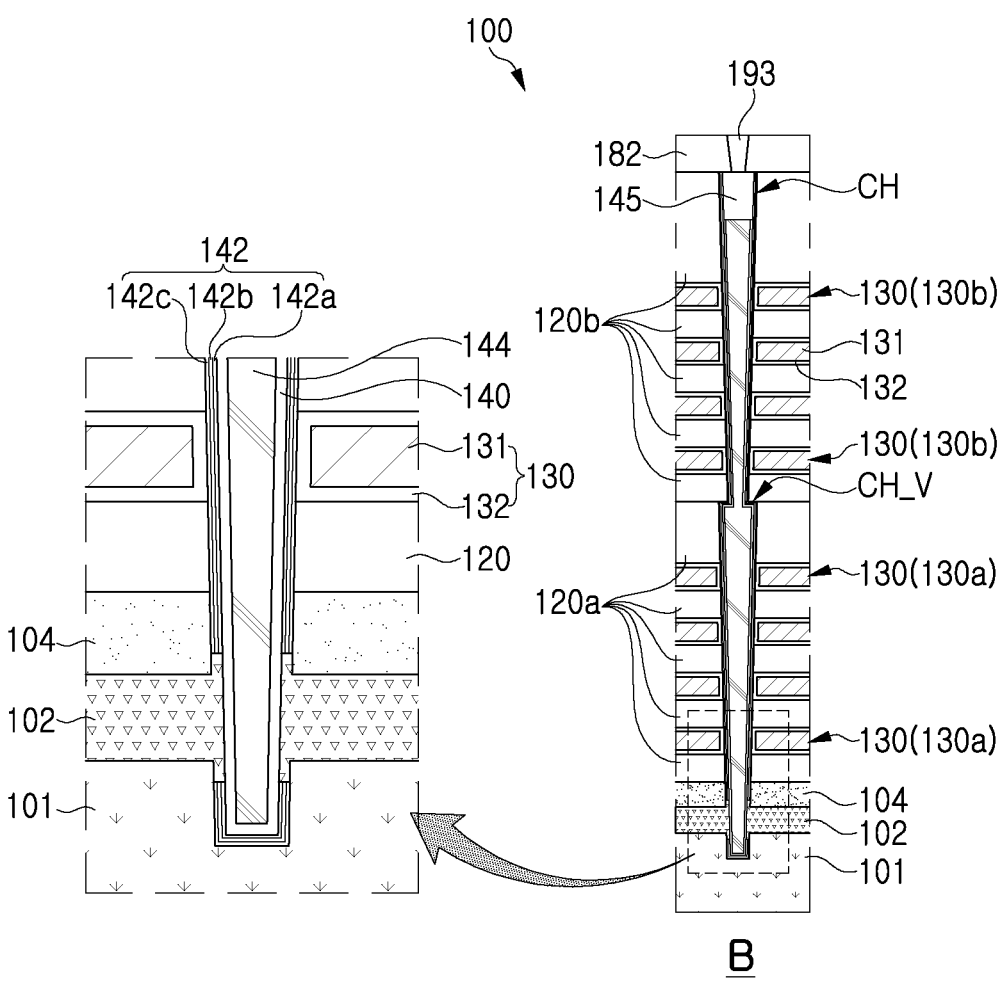

FIGS. 2 and 3 are schematic partially enlarged views of the semiconductor device 100 according to example embodiments. FIG. 2 is an enlarged view of a region 'A' of FIG. 1A and FIG. 3 is an enlarged view of a region B' of FIG. 1A.

Referring to FIGS. 1A to 3, the semiconductor device 100 may include a peripheral circuit structure PERI including a first substrate 201 and a memory cell structure CELL including a second substrate 101. The memory cell structure CELL may be disposed on the peripheral circuit PERI. Conversely, in example embodiments, the memory cell structure CELL may be disposed below the peripheral circuit structure PERI in the Z direction.

In an example embodiment, the semiconductor device 100 may further include through-wiring regions TA1 and TA2 that pass through the memory cell structure CELL to connect the memory cell structure CELL and the peripheral circuit structure PERI. The through-wiring regions TA1 and TA2 may include through-contact plugs 174*a* and 174*b* disposed in the through-wiring regions TA1 and TA2 to electrically connect the peripheral circuit structure PERI and the memory cell structure CELL.

The peripheral circuit structure PERI may include a first substrate 201, device separation layers 210 in the first substrate 201, circuit elements 220 with at least a gate disposed on the first substrate 201, a circuit wiring structure INT electrically connected to the circuit elements 220, a peripheral insulating structure 230 on and at least partially covering the circuit elements 220 and the circuit wiring structure INT on the first substrate 201, and a dam structure 240.

The first substrate 201 may have an upper surface extending in an X-direction and a Y-direction. The first substrate 201 may include a semiconductor material, for example, a group IV semiconductor, a group III-V compound semiconductor, or a group II-VI compound semiconductor. The first substrate 201 may be provided as a bulk wafer or an epitaxial layer.

An active region may be defined by the device separation layers 210 in the first substrate 210. The device separation layers 210 may be formed using shallow trench isolation techniques.

The circuit elements 220 may include a planar transistor including source/drain regions 221 and a peripheral gate structure.

The source/drain regions 221 may be regions including impurities in a portion of the active region. The source/drain regions 221 may be spaced apart from each other in the active region.

The peripheral gate structure may be disposed on the active region between the source/drain regions 221. The peripheral gate structure may include a circuit gate dielectric layer 222, a spacer layer 224, a circuit gate electrode 225, and a circuit gate capping layer 226. The circuit gate dielectric layer 222 may be disposed between the first substrate 201 and the circuit gate electrode 225. In some embodiments, the circuit gate dielectric layer 22 may be on and at least partially cover a side surface together with a lower surface of the circuit gate electrode 225. The spacer layer 224 may be on and at least partially cover sidewalls of the circuit gate electrode 225 or the circuit gate dielectric layer 222. The source/drain regions 221 may be disposed in the first substrate 201 at both sides of the circuit gate electrode 225. The circuit gate capping layer 226 may be disposed on the circuit gate electrode 225 and may include an insulating material such as silicon nitride.

In an example embodiment, the peripheral circuit structure PERI may further include an insulating liner 217 on at least partially covering the circuit elements 220. The insulating liner 217 may include silicon nitride.

The circuit wiring structure INT may be configured to apply an electrical signal to the circuit elements 220. The circuit wiring structure INT may be electrically connected to the source/drain regions 221, but may also be connected to the circuit gate electrode 225 in some embodiments.

The circuit wiring structure INT may include a plurality of connection patterns INT1, INT2, and INT3 disposed on different height levels. For example, the plurality of connection patterns INT1, INT2, and INT3 may include lower connection patterns INT1 electrically connected to the circuit elements 220, intermediate connection patterns INT2 electrically connected to the lower connection patterns INT1 and disposed on a level higher than the lower connection patterns INT1, and upper connection patterns INT3 electrically connected to the intermediate connection patterns INT2 and disposed on a level higher in the Z direction than the intermediate connection patterns INT2. Although the plurality of connection patterns INT1, INT2, and INT3 are illustrated with three levels, the number of layers of the plurality of connection patterns INT1, INT2, and INT3 is not limited thereto and may be variously changed.

Each of the plurality of connection patterns INT1, INT2, and INT3 may include a wiring portion INT_I and a via portion INT_V extending downward in the Z direction from a portion of the wiring portion INT_I.

In an example embodiment, at least one of the plurality of connection patterns INT1, INT2, and INT3 may have a dual damascene structure formed by a dual damascene process of simultaneously forming the wiring portion INT_I and the via portion INT_V. Here, the damascene process may include forming an insulating layer, forming an opening in the insulating layer, and forming a connection pattern in the opening. In some embodiments, at least one of the plurality of connection patterns INT1, INT2, and INT3 may include a single damascene structure in which the via portion INT_V is formed by a single damascene process and a single damascene structure in which the wiring portion INT_I is formed by a single damascene process. Also, according to embodiments, the connection patterns disposed at different levels in the Z direction, among the plurality of connection patterns INT1, INT2, and INT3, may be formed in a form in which a single damascene structure and a dual damascene structure are combined.

As illustrated in FIG. 2, each of the plurality of connection patterns INT1, INT2, and INT3 may include a metal material pattern PL and a conductive barrier layer BM on and at least partially covering side surfaces and a bottom surface of the metal material pattern PL. In an example embodiment, the metal material pattern PL may include a metal material, such as tungsten (W), and the conductive barrier layer BM may include a metal nitride such as titanium nitride (TiN).

The peripheral insulating structure 230 may be on and at least partially cover the circuit elements 220 on the first substrate 201. In an example embodiment, the peripheral insulating structure 230 may be disposed on the insulating liner 217. The circuit wiring structure INT may pass through a portion of the peripheral insulating structure 230 and may be connected to the source/drain regions 221 or the circuit gate electrode 225.

The peripheral insulating structure 230 may include first to fifth insulating layers 231, 232, 233, 234, and 236 sequentially stacked on the first substrate 201, and a capping layer 235 disposed between the fourth insulating layer 234 and the fifth insulating layer 236.

The first insulating layer 231 may border or at least partially surround side surfaces of the lower connection patterns INT_I. The second insulating layer 232 may border or at least partially surround side surfaces of the intermediate connection patterns INT2. The third insulating layer 233 may border or at least partially surround side surfaces of the upper connection patterns INT3. The first to third insulating layers 231 to 233 may include an insulating material, for example, silicon oxide.

The fourth insulating layer 234 may be disposed on the third insulating layer 233 and may have a thickness less than that of the third insulating layer 223. The capping layer 235 may be disposed on the fourth insulating layer 234 and may have a thickness less than that of the fifth insulating layer 236.

The fourth insulating layer 234 may be an intermediate insulating layer disposed between the capping layer 235 and the upper connection patterns INT3. In this specification, the fourth insulating layer 234 may be referred to as an 'intermediate insulating layer'. The fourth insulating layer 234 may improve a bridge defect problem of the upper connection patterns INT3 that may occur during a process of forming the capping layer 235. The bridge defect may include a problem of leakage current occurring between adjacent upper connection patterns INT3 due to diffusion of a residual material in the upper connection patterns INT3 due to a deposition process of the capping layer 235. As the fourth insulating layer 234 separates the capping layer 235 from the upper connection patterns INT3, the bridge defect may be prevented or improved. Accordingly, the semiconductor device 100 having an improved production yield may be provided.

In addition, by including the fourth insulating layer 234 to reduce or prevent leakage current of the upper connection pattern INT3, the upper connection patterns INT3 adjacent to each other may be disposed relatively close to each other, and accordingly, a circuit wiring structure INT having an improved integration and the semiconductor device 100 including the same may be provided.

The fourth insulating layer 234 and the capping layer 235 may have a desired or optimal thickness to improve the bridge defect. In an example embodiment, the capping layer 235 may have a thickness greater than that of the fourth insulating layer 234. The thickness of the capping layer 235 may be in the range of, for example, about 200 Å to about 400 Å, and the thickness of the fourth insulating layer 234 may be in the range of about 100 Å to about 300 Å.

The capping layer 235 may include an insulating material different from that of the first to fifth insulating layers 231, 232, 233, 234, and 236. In an example embodiment, the capping layer 235 may include silicon nitride, silicon oxynitride, or a nitride-based material, and the fourth insulating layer 234 may include silicon oxide.

The fifth insulating layer 236 may be disposed on the capping layer 235. An upper surface of the fifth insulating layer 236 may correspond to an upper surface of the peripheral circuit structure PERI. Accordingly, the fifth insulating layer 236 may contact the second substrate 101. The fifth insulating layer 236 may include an insulating material, for example, silicon oxide.

The dam structure 240 may pass through the fourth insulating layer 234 to contact the upper connection pattern INT3. The dam structure 240 may border or at least partially surround a portion of side surfaces of the through-contact plugs 174.

As illustrated in FIG. 1C, the dam structure 240 may have a shape bordering or at least partially surrounding a portion of a side surface of each of the through-contact plugs 174. In a plan view, the dam structure 240 may have a circular shape bordering or at least partially surrounding the through-contact plugs 174, but embodiments are not limited thereto, and may have various shapes, such as an oval, a rectangle, or a square and may border or at least partially surround the through-contact plugs 174.

In an example embodiment, the dam structure 240 may extend into the upper connection pattern INT3 by a predetermined depth. Accordingly, a lower end 240_LE of the dam structure 240 may be positioned on a level lower in the Z direction than an upper end INT3_UE of the upper connection pattern INT3. In this specification, 'upper/lower end' may mean a portion positioned at the highest/lowest height level in the Z direction of the corresponding component.

However, according to embodiments, as the dam structure 240 contacts without extending into the upper connection pattern INT3, the lower end 240_LE of the dam structure 240 and the upper end INT3_UE of the upper connection pattern INT3 may be on substantially the same level in the Z direction.

An upper surface of the dam structure 240 may be positioned on a level lower in the Z direction than an upper surface of the peripheral circuit structure PERI, that is, an upper surface of the fifth insulating layer 236.

In an example embodiment, the upper surface of the dam structure 240 may be positioned on a level higher in the Z direction than the upper surface of the capping layer 235. In this case, the dam structure 240 may partially extend into the fifth insulating layer 236 through the fourth insulating layer 234 and the capping layer 235. Accordingly, the dam structure 240 may include a first portion bordered or at least partially surrounded by the fourth insulating layer 234, a second portion surrounded by the capping layer 235, and a third portion bordered or at least partially surrounded by the fifth insulating layer 236.

In an example embodiment, in a horizontal direction parallel to the first substrate 201, for example, in the X-direction, a width of the dam structure 240 may be less than a width of the upper connection pattern INT3. Accordingly, an upper surface of the upper connection pattern INT3 may include a portion in contact with the fourth insulating layer 234 and a portion in contact with the dam structure 240. That is, the fourth insulating layer 234 may be on and at least partially cover at least a portion of the upper connection pattern INT3.

The dam structure 240 may include a material different from that of the fourth insulating layer 234. In an example embodiment, when the fourth insulating layer 234 includes silicon oxide, the dam structure 240 may include a semiconductor material, such as silicon nitride, polysilicon, or a metal material such as tungsten.

The dam structure 240 may be a structure for separating the through-contact plugs 174 from the fourth insulating layer 234. The dam structure 240 may prevent or reduce the occurrence of a phenomenon a mold collapse occurring in a cleaning process performed after forming a contact hole for forming the through-contact plugs 174. That is, the dam structure 240 may be a barrier structure separating the contact hole from the fourth insulating layer 234 in the cleaning process to prevent or reduce the occurrence of the fourth insulating layer 234 being removed.

The memory cell structure CELL may include a second substrate 101 disposed on the peripheral insulating structure 230 and having a first region R1 and a second region R2, a first horizontal conductive layer 102 on the first region R1 of the second substrate 101, a horizontal insulating layer 110 disposed to be parallel to the first horizontal conductive layer 102 on the second region R2 of the second substrate 101, a second horizontal conductive layer 104 on the first horizontal conductive layer 102 and the horizontal insulating layer 110, a stack structure GS including gate electrodes 130*a* and 130*b* and interlayer insulating layers 120*a* and 120*b*, alternately stacked on the second horizontal conductive layer 104, capping insulating layers 181*a* and 181*b* on at least partially covering the stack structure GS, separation structures MS extending through a portion of the stack structure GS, upper separation structures SS passing through a portion of the stack structure GS, and channel structures CH disposed to pass through the stack structure GS and including a channel layer 140.

In an example embodiment, the memory cell structure CELL may further include upper insulating layers 182, 183, and 184, a gate contact plug 161, wiring lines 192, and a wiring via 193.

The second substrate 101 may contact an upper surface of the fifth insulating layer 236. The first region R1 of the second substrate 101 may be a region in which the gate electrodes 130 are vertically stacked and the channel structures CH are disposed, and may be a region in which memory cells are disposed, and the second region R2 is a region in which the gate electrodes 130 extend to have different lengths, and may correspond to a region for electrically connecting the memory cells to the peripheral circuit structure PERI. The second region R2 may be disposed at at least one end of the first region R1 in at least one direction, for example, the X-direction.

The second substrate 101 may have an upper surface extending in the X-direction and the Y-direction. The second substrate 101 may have a thickness greater than that of the first and second horizontal conductive layers 102 and 104. The second substrate 101 may be formed of a semiconductor material, for example, and may be provided as a polycrystalline semiconductor layer, such as a polycrystalline silicon layer or an epitaxial layer.

The first and second horizontal conductive layers 102 and 104 may be sequentially stacked and disposed on the upper surface of the first region R1 of the second substrate 101. The first horizontal conductive layer 102 may not extend to the second region R2 of the second substrate 101, and the second horizontal conductive layer 104 may extend to the second region R2.

The first horizontal conductive layer 102 may function as a portion of a common source line of the semiconductor device 100, for example, as a common source line together with the second substrate 101. As illustrated in the enlarged view of FIG. 3, the first horizontal conductive layer 102 may be directly connected to the channel layer 140 at the perimeter of the channel layer 140.

The second horizontal conductive layer 104 may contact the second substrate 101 in some regions in which the first horizontal conductive layer 102 and the horizontal insulating layer 110 are not disposed. The second horizontal conductive layer 104 may be on and at least partially cover an end of the first horizontal conductive layer 102 or the horizontal insulating layer 110 in the above regions, and may be bent to extend onto the second substrate 101. That is, the second horizontal conductive layer 104 may at least partially fill a space between the first horizontal conductive layer 102 and the horizontal insulating layer 110. In an example embodiment, the second horizontal conductive layer 104 may function as a common source line together with the first horizontal conductive layer 102. That is, the second substrate 101, the first horizontal conductive layer 102, and the second horizontal conductive layer 104 may form a source structure functioning as a common source line.

The first and second horizontal conductive layers 102, 104 may include a semiconductor material, and for example, both the first and second horizontal conductive layers 102 and 104 may include polycrystalline silicon.

The horizontal insulating layer 110 may be disposed on the second substrate 101 in parallel to the first horizontal conductive layer 102 in at least a portion of the second region R2. The horizontal insulating layer 110 may be a layer remaining after a portion is replaced with the first horizontal conductive layer 102 in a manufacturing process of the semiconductor device 100.

The horizontal insulating layer 110 may include silicon oxide, silicon nitride, silicon carbide, or silicon oxynitride. In an example embodiment, the horizontal insulating layer 110 may include first to third horizontal insulating layers sequentially stacked, the first and third horizontal insulating layers may be silicon oxide layers, and the second horizontal insulating layer may be a silicon nitride layer.

In the example embodiment, the memory cell structure CELL may further include inner insulating layers 109a and 109b passing through the second substrate 101 on the peripheral insulating structure 230 and the second horizontal conductive layer 104 and an outer insulating layer 109c disposed on an outer side of the second substrate 101. In an example embodiment, the inner insulating layers 109a and 109b may include a first inner insulating layer 109a passing through the horizontal insulating layer 110 on the second region R2 and a second inner insulating layer 109b passing through the first horizontal conductive layer 102 on the first region R1.

The gate electrodes 130 may be vertically (Z direction) spaced apart from each other and stacked on the second substrate 101 to form a stack structure GS. The gate electrodes 130 are vertically spaced apart from each other and stacked on the first region R1, and extend from the first region R1 to the second region R2 to have different lengths to form a step structure in the form of a step. As illustrated in FIG. 1A, the gate electrodes 130 may form a step structure between the gate electrodes 130 in the X-direction. Due to the step structure, the gate electrodes 130 form a step shape in which the lower gate electrode 130 extends longer than the upper gate electrode 130, and provide ends exposed upward from the interlayer insulating layers 120. The ends may be gate pads GP in which the gate electrodes 130 and the gate contact plug 161 contact each other. In example embodiments, the gate pads GP may have a relatively increased thickness compared to the remaining regions of the gate electrodes 130.

As illustrated in FIG. 1B, the gate electrodes 130 may be disposed to be separated from each other in the Y-direction by separation structures MS extending in the X-direction. The gate electrodes 130 between a pair of separation structures MS may form a memory block, but the scope of the memory block is not limited thereto in accordance with various embodiments.

The gate electrodes 130 may include a metal material, for example, tungsten (W). In some embodiments, the gate electrodes 130 may include polycrystalline silicon or a metal silicide material. In an example embodiment, the gate electrodes 130 may further include a gate electrode layer 131 and a gate dielectric layer 132 on and at least partially covering a side surface, an upper surface, and a lower surface of the gate electrode layer. The gate dielectric layer 132 may be disposed between the interlayer insulating layers

120 and the channel structures CH and the gate electrode layer 131. The gate dielectric layer 132 may include, for example, aluminum oxide (AlO).

The interlayer insulating layers 120 may be alternately stacked with the gate electrodes 130 on the second substrate 101 to form the stack structure GS. The interlayer insulating layers 120 may be disposed between the gate electrodes 130. Like the gate electrodes 130, the interlayer insulating layers 120 may be spaced apart from each other in a direction, perpendicular to the upper surface of the second substrate 101 and may be disposed to extend in the X-direction. The interlayer insulating layers 120 may include an insulating material, such as silicon oxide or silicon nitride.

In an example embodiment, the stack structure GS may include a lower stack structure GS1 and an upper stack structure GS2. The lower stack structure GS1 may include first gate electrodes 130a and first interlayer insulating layers 120a that are alternately stacked. The upper stack structure GS2 may include second gate electrodes 130b and second interlayer insulating layers 120b that are alternately stacked. In an example embodiment, the number of the first gate electrodes 130a may be greater than the number of the second gate electrodes 130b, but embodiments of the present inventive concept are not limited thereto and the number of the first and second gate electrodes 130a and 130b may be variously changed. The lower stack structure GS1 may further include an intermediate insulating layer 125 in contact with the upper stack structure GS2. The intermediate insulating layer 125 may be disposed below the upper stack structure GS2.

The capping insulating layers 181a and 181b may be on and at least partially cover the stack structure GS on the second substrate 101. In an example embodiment, the capping insulating layers 181a and 181b may include the same material as the interlayer insulating layers 120a and 120b, for example, silicon oxide. In an example embodiment, the capping insulating layers 181a and 181b may include a lower capping insulating layer 181a on and at least partially covering a side surface of the lower stack structure GS1 and an upper capping insulating layer 181b on and at least partially covering a side surface of the upper stack structure GS2 on the lower capping insulating layer 181a.

The upper insulating layers 182, 183, and 184 may be disposed on the capping insulating layers 181a and 181b and may include an insulating material, such as silicon oxide. In an example embodiment, the upper insulating layers 182, 183, and 184 may include a first upper insulating layer 182, a second upper insulating layer 183, and a third upper insulating layer 184 sequentially stacked on the upper surfaces of the capping insulating layers 181a and 181b.

The separation structures MS may be disposed to extend in the X-direction through the gate electrodes 130 as illustrated in FIG. 1B. The separation structures MS may pass through the entire gate electrodes 130 stacked on the second substrate 101 to be connected to the second substrate 101. The separation structures MS may pass through the first horizontal conductive layer 102 on the first region R1 and pass through the horizontal insulating layer 110 on the second region R2. The separation structures MS may be spaced apart from each other in the Y-direction and disposed in parallel. In an example embodiment, the separation structures MS may include silicon oxide, silicon nitride, silicon oxynitride, or a combination thereof, but, in some embodiments, the separation structures MS may include a conductive pattern and an insulating material layer on and at least partially covering side surfaces of the conductive pattern.

The upper separation structures SS may extend in the X-direction between the separation structures MS on the first region R1. The upper separation structures SS may be disposed to pass through a portion of the gate electrodes 130 including the uppermost gate electrode among the gate electrodes 130. The upper separation structures SS may separate the one or more gate electrodes 130 from each other in the Y-direction. However, the number of gate electrodes 130 separated by the upper separation structures SS may be variously changed in different embodiments. The gate electrodes 130 separated by the upper separation structures SS may form different string selection lines. The upper separation structures SS may include an insulating material, for example, silicon oxide, silicon nitride, or silicon oxynitride.

The channel structures CH pass through the gate electrodes 130, the second horizontal conductive layer 104, and the first horizontal conductive layer 102 on the first region R1 to contact the second substrate 101. The channel structures CH may extend into the second substrate 101 to contact the second substrate 101, but embodiments are not limited thereto. The channel structures CH may have a columnar shape, and may have inclined side surfaces that narrow with closer proximity to the second substrate 101 according to an aspect ratio. The channel structures CH may each form one memory cell string, and may be disposed to be spaced apart from each other, while forming rows and columns on the first region R1. The channel structures CH may be disposed to form a grid pattern or may be disposed in a zigzag shape in one direction.

Referring to FIG. 3, the channel layer 140 may be disposed in the channel structures CH. In the channel structures CH, the channel layer 140 may be formed in an annular shape bordering or at least partially surrounding a channel filling insulating layer 144 therein, but according to an embodiment, the channel layer 140 may have a columnar shape, such as a cylinder or a prism without the channel filling insulating layer 144. The channel filling insulating layer 144 may include an insulating material, such as silicon oxide. The channel layer 140 may be connected to the first horizontal conductive layer 102 at a lower portion. The channel layer 140 may include a semiconductor material, such as polycrystalline silicon or single crystal silicon.

In an example embodiment, each of the channel structures CH may further include a dielectric layer 142 and a conductive pad 145. The dielectric layer 142 may be disposed between the gate electrodes 130 and the channel layer 140. The dielectric layer 142 may border or at least partially surround at least a portion of an outer surface of the channel layer 140. As illustrated in the enlarged view of FIG. 3, the dielectric layer 142 may include a tunneling layer 142a, a charge storage layer 142b, and a blocking layer 142c sequentially stacked from the channel layer 140. The tunneling layer 142a may be configured to tunnel charges into the charge storage layer 142b, and may include, for example, silicon oxide ($SiO_2$), silicon nitride ($Si_3N_4$), silicon oxynitride (SiON), or a combination thereof. The charge storage layer 142b may be a charge trapping layer or a floating gate conductive layer. The blocking layer 142c may be configured to block charges trapped in the charge storage layer 142b from moving to the gate electrodes 130 and may include, for example, silicon oxide ($SiO_2$), silicon nitride ($Si_3N_4$), silicon oxynitride (SiON), a high-k dielectric material, or a combination thereof.

As illustrated in the enlarged view of FIG. 3, the first horizontal conductive layer 102 may include a portion passing through the dielectric layer 142 to contact the channel layer 140. The portion passing through the dielectric layer 142 may be on and at least partially cover at least a portion of a side surface of the second horizontal conductive layer 104 and at least a portion of a side surface of the second substrate 101. The first horizontal conductive layer 102 may have a thickness greater than the remaining portion in the portion passing through the dielectric layer 142.

The conductive pad 145 may be disposed to be electrically connected to the channel layer 140. In an example embodiment, the conductive pad 145 may be on and at least partially cover an upper surface of the channel filling insulating layer 144 on the upper surface of the channel filling insulating layer 144, and the channel layer 140 may border or at least partially surround the side surface of the conductive pad 145. In other embodiments, the conductive pad 145 may be disposed on top of the channel layer 140. The conductive pad 145 may include, for example, doped polycrystalline silicon.

In an example embodiment, each of the channel structures CH may include a first channel structure penetrating the lower stack structure GS1 and a second channel structure penetrating the upper stack structure GS2. The first and second channel structures may be connected to each other to extend integrally, and each of the channel structures CH may include a channel bending portion CH_V in a region in which the first and second channel structures contact each other.

As illustrated in FIG. 1A, the gate contact plug 161 may pass through the first upper insulating layer 182, the second upper insulating layer 183, and the capping insulating layers 181a and 181b on the second region R2 to be connected to the gate pads GP.

In an example embodiment, the memory cell structure CELL may further include a source contact plug 162 spaced apart from the gate electrodes 130a and 130b and contacting the second substrate 101.

Each of the through-contact plugs 174 may pass through the capping insulating layers 181a and 181b, the first upper insulating layer 182, and the second upper insulating layer 183, and may be connected to the upper connection patterns INT3. The through-contact plugs 174 and the circuit wiring structure INT may be signal paths for electrically connecting the gate electrodes 130 and the circuit elements 220.

The through-contact plugs 174 may include a lower portion 174L and an upper portion on the lower portion 174U.

As illustrated in FIG. 2, each of the through-contact plugs 174 may pass through the dam structure 240 to contact the upper connection pattern INT3. The lower portion 174L may refer to a portion passing through the dam structure 240 to contact the upper connection pattern INT3. At least a portion of a side surface of the lower portion 174L may be bordered or at least partially surrounded by the dam structure 240. The through-contact plugs 174 may be disposed to be spaced apart from the fourth insulating layer 234 by the dam structure 240. In an example embodiment, the through-contact plugs 174 may also be spaced apart from the capping layer 235 by the dam structure 240.

The upper portion 174U may be a portion on lower portion 174L. The upper portion 174U may not be bordered or at least partially surrounded by the dam structure 240. The lower portion 174L and the upper portion 174U of each of the through-contact plugs 174 may be connected to each other.

In an example embodiment, each of the through-contact plugs 174 may extend into the upper connection patterns INT3 by a predetermined depth through the dam structure 240 to contact the upper connection patterns INT3. Accordingly, lower ends 174_LE of the through-contact plugs 174 may be positioned on a level lower in the Z direction than the upper end INT3_UE of the upper connection pattern INT3 and/or the lower end 240_LE of the dam structure 240.

The through-contact plugs 174 may extend into the upper connection patterns INT3 by a predetermined depth to contact the upper connection patterns INT3, thereby increasing a contact area with the upper connection patterns INT3 to improve contact resistance characteristics.

However, according to embodiments, the lower ends 174_LE of the through-contact plugs 174 and the lower end 240_LE of the dam structure 240 may be positioned at substantially the same level in the Z direction as the through-contact plugs 174 contact the upper connection patterns INT3, without extending into the upper connection pattern INT3.

The through-contact plugs 174 may include a conductive material, for example, tungsten (W), copper (Cu), aluminum (Al), or the like. In an example embodiment, each of the through-contact plugs 174 may include a plug layer 174-1 having a metal material and a barrier layer 174-2 on and at least partially covering a side surface and a bottom surface of the metal plug layer 174-1 and including metal nitride.

In an example embodiment, the through-contact plugs 174 may include first and second through-contact plugs 174a and 174b passing through the inner insulating layers 109a and 109b and a third through-contact plug 174c passing through the outer insulating layer 109c.

The wiring lines 192 and the wiring via 193 may constitute an upper wiring structure electrically connected to memory cells in the memory cell structure CELL. The wiring lines 192 may be disposed on the third upper insulating layer 184. The wiring lines 192 may be electrically connected to, for example, through-contact plugs 174, the gate contact plug 161, and either the gate electrodes 130 or the channel structures CH. The wiring via 193 may pass through the third upper insulating layer 184 and electrically connect the wiring lines 192, the through-contact plugs 174, and either the gate contact plug 161 or the channel structures CH. The number of contact plugs and wiring lines constituting the wiring structure may be variously changed in some embodiments. The wiring lines 192 and the wiring via 193 may include metal, for example, tungsten (W), copper (Cu), aluminum (Al), or the like.

The through-wiring regions TA1 and TA2 may be regions including wiring structures for electrically connecting the memory cell structure CELL and the peripheral circuit structure PERI to each other. The gate electrodes 130 may not be disposed in the through-wiring regions TA1 and TA2.

In an example embodiment, the through-wiring regions TA1 and TA2 may include sacrificial insulating layers 118a and 118b disposed in parallel with at least a portion of the gate electrodes 130. The sacrificial insulating layers 118a and 118b may be insulating layers remaining without being replaced by gate electrodes 130a, 130b during a gate electrode forming process. The sacrificial insulating layers 118a and 118b may include an insulating material different from that of the interlayer insulating layers 120, for example, silicon nitride.

In an example embodiment, the through-wiring regions TA1 and TA2 may include a first through-wiring region TA1 and a second through-wiring region TA2. The first through-wiring region TA1 may include the sacrificial insulating layers 118a, the first inner insulating layer 109a, and the first through-contact plug 174a passing through the sacrificial insulating layers 118a and the first inner insulating layer 109a on the second region R2. The second through-wiring region TA2 may include the sacrificial insulating layers 118a and 118b, the second inner insulating layer 109b, and the second through-contact plug 174b passing through the sacrificial insulating layers 118a and 118b and the second inner insulating layer 109b.

In an example embodiment, the through-wiring regions TA1 and TA2 may further include a barrier structure disposed to border or at least partially surround the through-wiring regions TA1 and TA2 on the second substrate 101.

In an example embodiment, the through-wiring regions TA1 and TA2 may further include a third through-wiring region other than the first and second through-wiring regions TA1 and TA2. The third through-wiring region may be a region including a third through-contact plug 174c passing through the outer insulating layer 109c. The third through-wiring region may not include the sacrificial insulating layers 118a and 118b and/or the gate electrodes 130a and 130b.

Figure 4A:
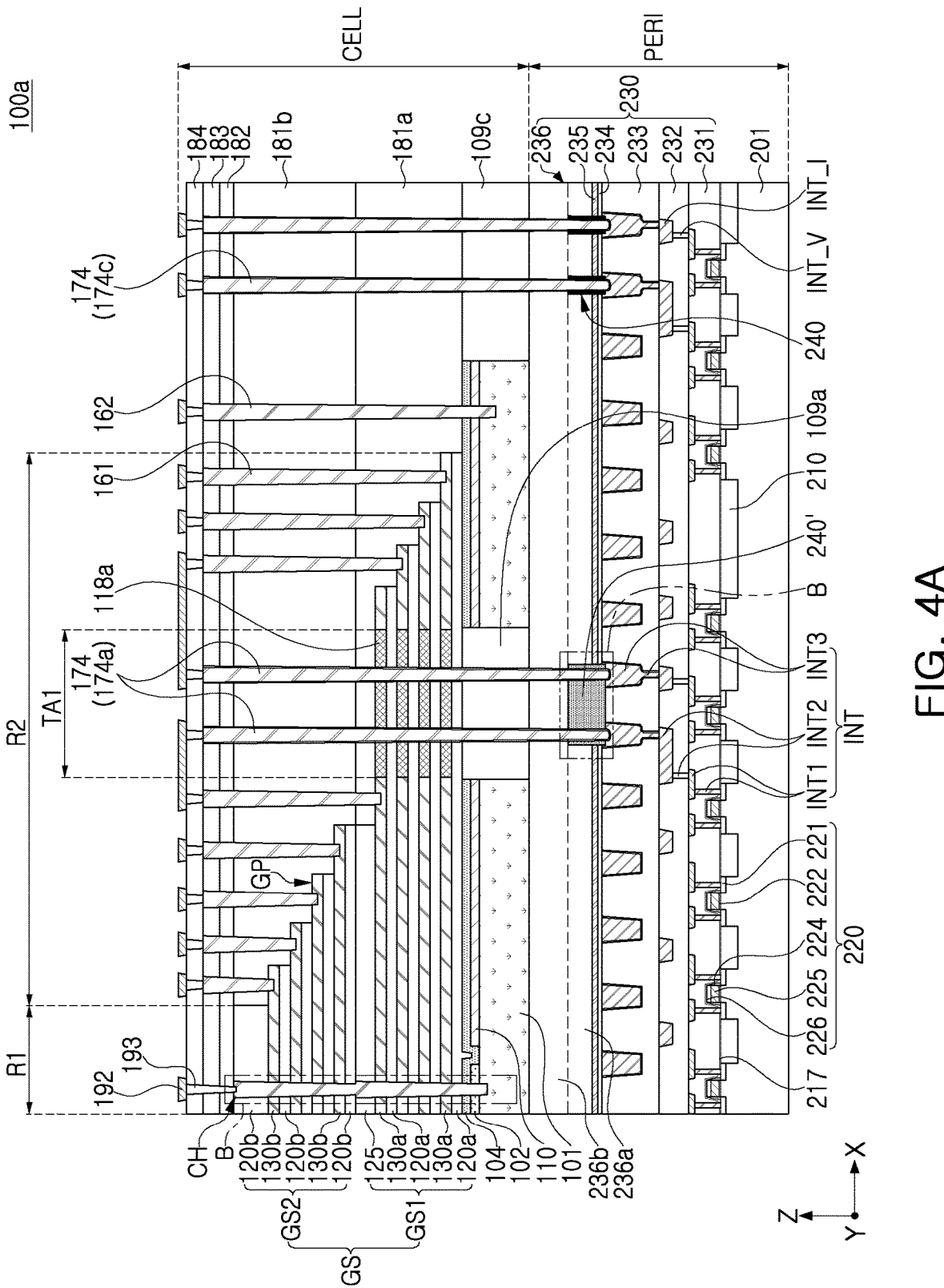
FIGS. 4A and 4B are a schematic cross-sectional view and a plan view of a semiconductor device according to example embodiments.
Figure 4B:
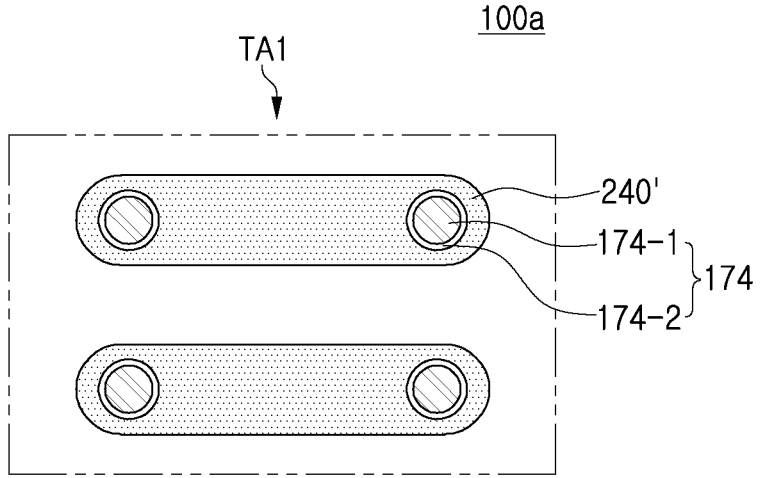
Figure 4B:
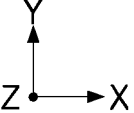

FIGS. 4A and 4B are a schematic cross-sectional view and a plan view of a semiconductor device 100a according to example embodiments. FIG. 4B is an enlarged plan view of a region corresponding to FIG. 1C.

Referring to FIGS. 4A and 4B, the dam structure 240' may border or at least partially surround the plurality of through-contact plugs 174, without bordering or at least partially surrounding a side surface of each of the through-contact plugs 174. However, the shape of the dam structure 240' is not limited to that illustrated in FIG. 4B and may be variously changed in accordance with various embodiments. As the semiconductor device 100a according to the example embodiments has the dam structure 240' having a relatively large planar area compared to the semiconductor device 100 of FIGS. 1 through 1C, a difficulty of the process for forming the dam structure may be improved.

In an example embodiment, the dam structure 240' may border or at least partially surround the plurality of through-contact plugs 174 arranged in any one direction, for example, the X-direction. However, embodiments of the present inventive concept are not limited thereto, and the shape of the dam structure 240' may be modified as illustrated in FIG. 5.

Figure 5:
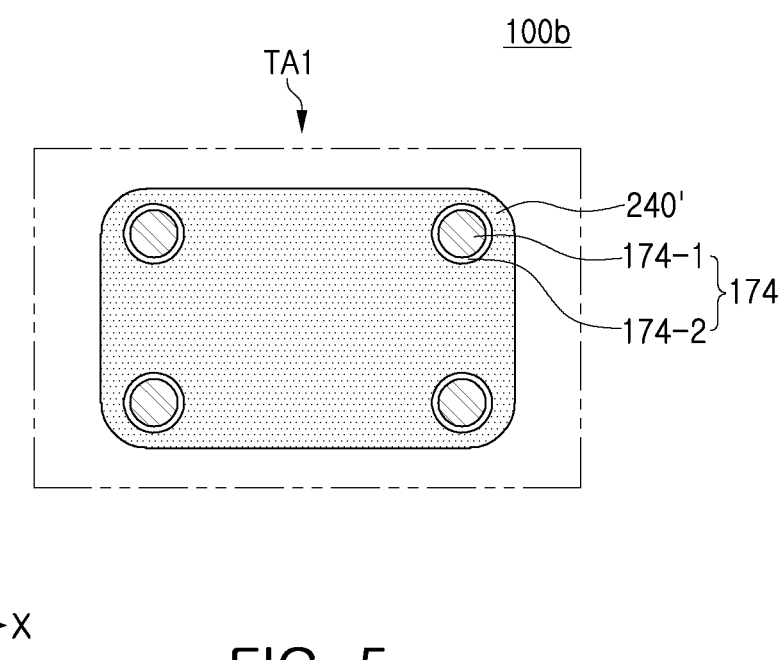
FIG. 5 is a schematic plan view of a semiconductor device according to example embodiments.

FIG. 5 is a schematic plan view of a semiconductor device 100b according to example embodiments. FIG. 5 is an enlarged plan view of a region corresponding to FIG. 1C.

Referring to FIG. 5, the dam structure 240' may border or at least partially surround a plurality of through-contact plugs 174 arranged in the X-direction and the Y-direction in one through-wiring region, for example, the first through-wiring region TA1.

Figure 6:
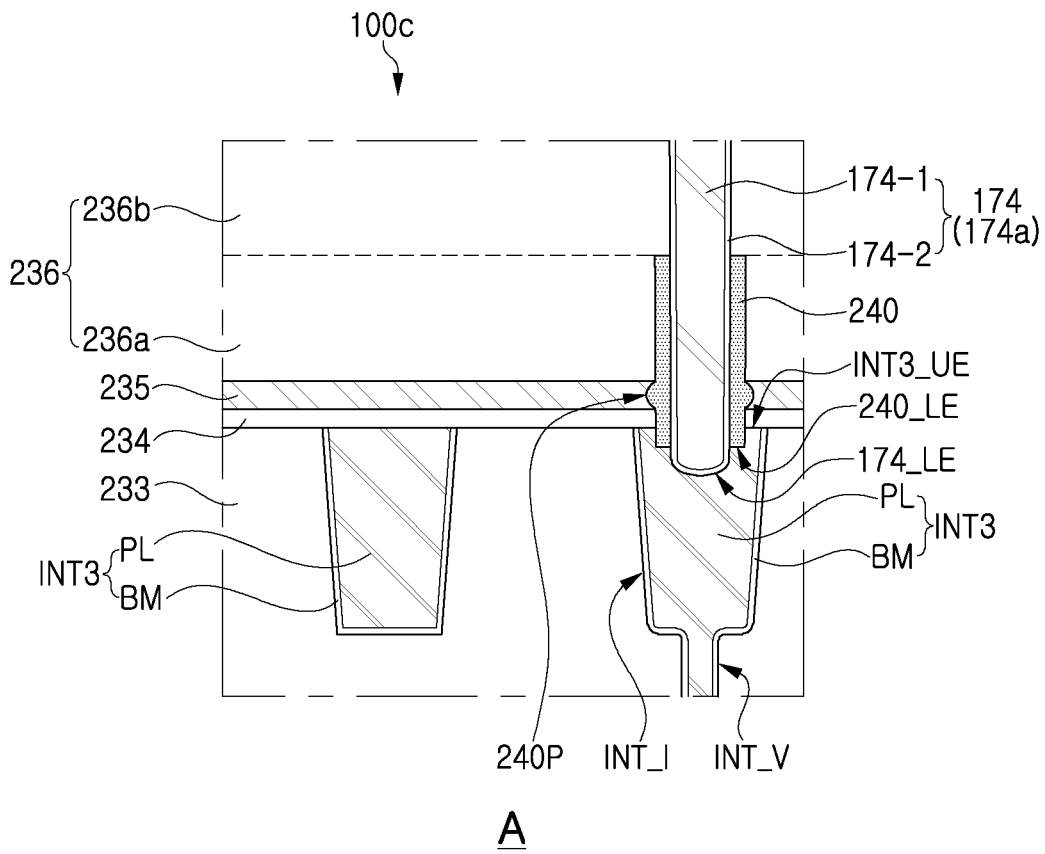
FIG. 6 is a schematic partially enlarged view of a semiconductor device according to example embodiments.

FIG. 6 is a schematic partially enlarged view of a semiconductor device 100c according to example embodiments. FIG. 6 is a partially enlarged view corresponding to region 'A' of FIG. 1A.

Referring to FIG. 6, the semiconductor device 100c may include a dam structure 240 different from that of the semiconductor device 100 of FIG. 2.

In the example embodiment, the dam structure 240 may include a first portion bordered or at least partially surrounded by the fourth insulating layer 234, a second portion bordered or at least partially surrounded by the capping layer 235, and a third portion bordered or at least partially surrounded by the fifth insulating layer 236.

The second portion of the dam structure 240 may include a protrusion 240P, which is a side surface convexly protruding in a direction toward the capping layer 235. Accordingly, the dam structure 240 may have a width at the second portion greater than a width at the first portion and/or the third portion. That is, in the dam structure 240, a planar area of the second portion may be greater than a planar area of a region adjacent to the second portion. This may be a structure caused due to a difference in etching rate between the capping layer 235 and the fourth and fifth insulating layers 234 and 236 in the process of forming an opening for forming the dam structure 240. However, the shape of the protrusion 240P, according to various embodiments, is not limited to that illustrated in the drawings.

The through-contact plugs 174 may not include a protrusion in a region passing through the first to third portions of the dam structure 240. In an example embodiment, the through-contact plugs 174 may have planar side surfaces, (e.g., inclined side surfaces) in a portion passing through the dam structure 240.

Figure 7:
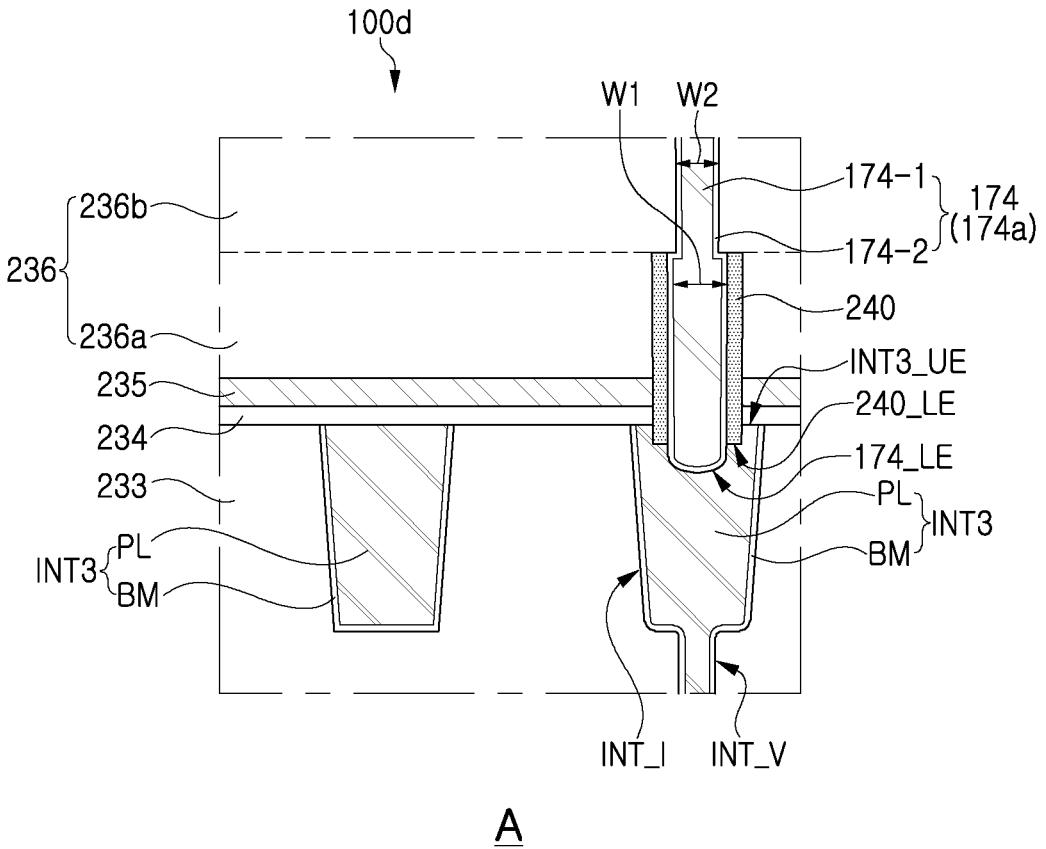
FIG. 7 is a schematic partially enlarged view of a semiconductor device according to example embodiments.

FIG. 7 is a schematic partially enlarged view of a semiconductor device 100d according to example embodiments. FIG. 7 is a partially enlarged view corresponding to region 'A' of FIG. 1A.

Referring to FIG. 7, the semiconductor device 100d may include through-contact plugs 174 different from those of the semiconductor device 100 of FIG. 2.

In the through-contact plugs 174, a first width W1 of a portion passing through the dam structure 240 may be different from a second width W2 of a portion passing through the fifth insulating layer 236. In an example embodiment, the first width W1 may be greater than the second width W2. This may be a structure caused due to a difference in etching rate between the fifth insulating layer 236 and the dam structure 240 in the process of forming the opening for forming the through-contact plugs 174.

Figure 8:
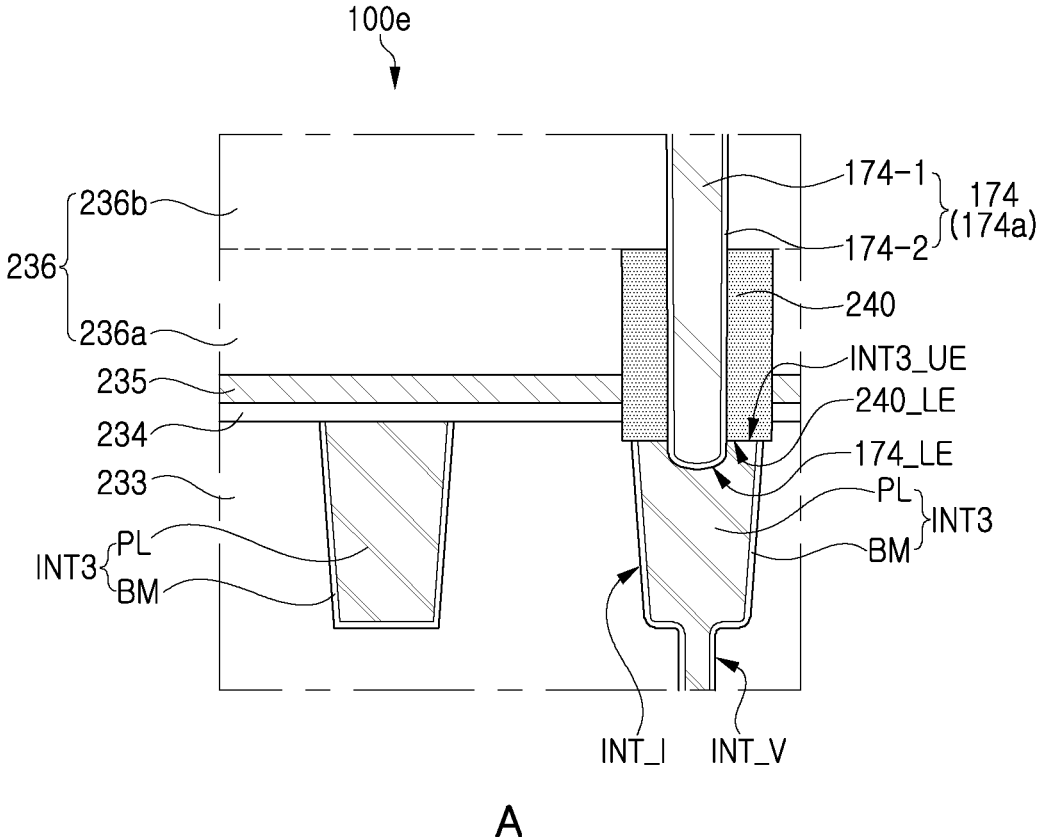
FIG. 8 is a schematic partially enlarged view of a semiconductor device according to example embodiments.

FIG. 8 is a schematic partially enlarged view of a semiconductor device 100e according to example embodiments. FIG. 8 is a partially enlarged view corresponding to region 'A' of FIG. 1A.

Referring to FIG. 8, the semiconductor device 100e may include a dam structure 240 different from that of the semiconductor device 100 of FIG. 2.

In the X-direction, a width of the dam structure 240 may be greater than a width of the upper connection pattern INT3. Accordingly, the lower surface of the dam structure 240 may include a portion in contact with the upper connection pattern INT3 and a portion in contact with the third insulating layer 233.

In other embodiments, the width of the dam structure 240 may be substantially the same as the width of the upper connection pattern INT3.

Figure 9:
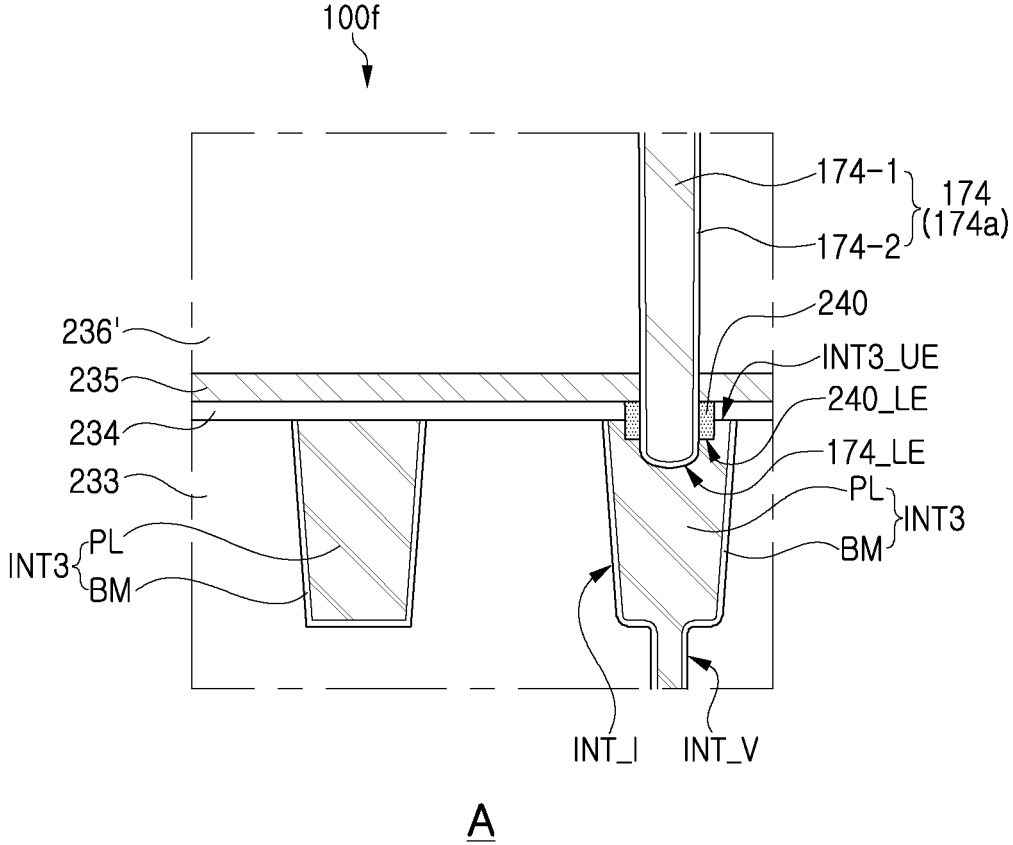
FIG. 9 is a schematic partially enlarged view of a semiconductor device according to example embodiments.

FIG. 9 is a schematic partially enlarged view of a semiconductor device 100f according to example embodiments. FIG. 9 is a partially enlarged view corresponding to region 'A' of FIG. 1A.

Referring to FIG. 9, the semiconductor device 100f may include a dam structure 240 different from that of the semiconductor device 100 of FIG. 2.

The capping layer 235 may be on and at least partially cover the upper surface of the dam structure 240. The upper surface of the dam structure 240 may be positioned at substantially the same level in the Z direction as the upper surface of the fourth insulating layer 234.

In some embodiments, the upper surface of the dam structure 240 may be positioned on a level in the Z direction between the upper surface and the lower surface of the fourth insulating layer 234. However, even in this case, the fourth insulating layer 234 may be spaced apart from the through-contact plugs 174 by the dam structure 240.

The through-contact plugs 174 may contact the capping layer 235. The through-contact plugs 174 may pass through the capping layer 235 and a portion of a side surface of the through-contact plugs 174 may be bordered or at least partially surrounded by the capping layer 235.

Figure 10:
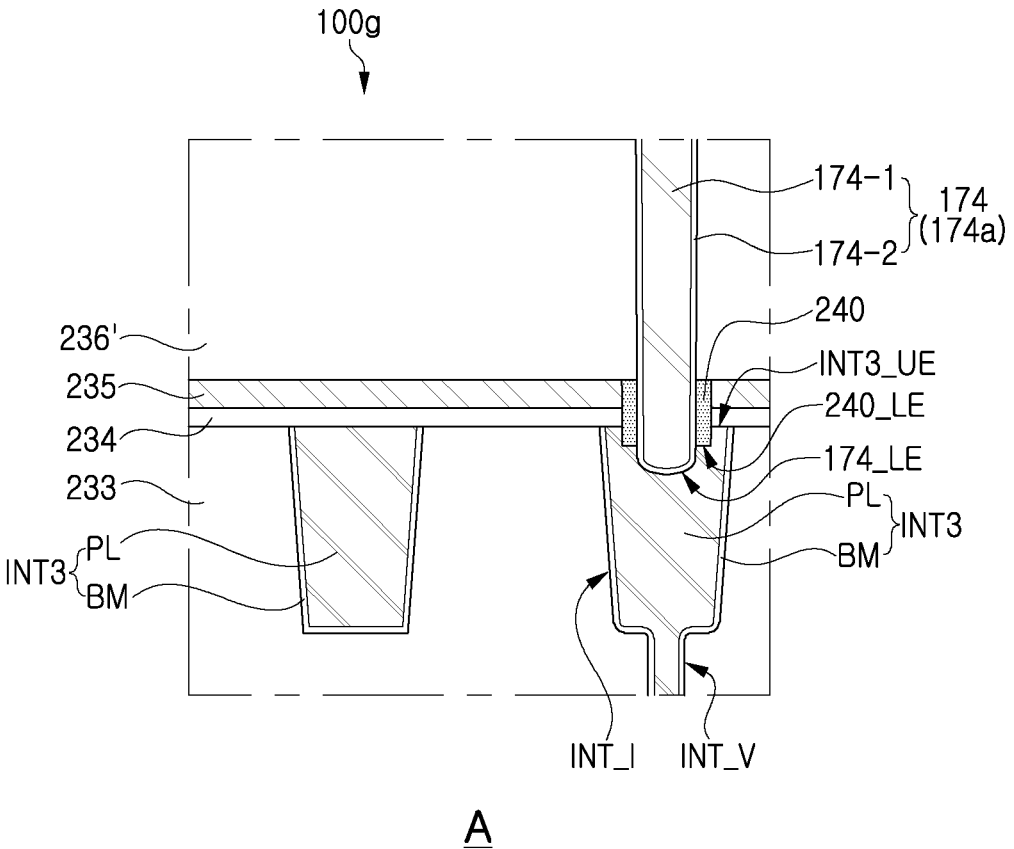
FIG. 10 is a schematic partially enlarged view of a semiconductor device according to example embodiments.

FIG. 10 is a schematic partially enlarged view of a semiconductor device 100g according to example embodiments. FIG. 10 is a partially enlarged view corresponding to region 'A' of FIG. 1A.

Referring to FIG. 10, the semiconductor device 100g may include a dam structure 240 different from that of the semiconductor device 100 of FIG. 2.

The fifth insulating layer 236' may be on and at least partially cover the upper surface of the dam structure 240, and the capping layer 235 and the fourth insulating layer 234 may be on and at least partially cover the side surface of the dam structure 240. The upper surface of the dam structure 240 may be positioned at substantially the same level in the Z direction as the upper surface of the capping layer 235.

However, according to embodiments, the upper surface of the dam structure 240 may be positioned on a level in the Z direction between the upper surface and the lower surface of the capping layer 235.

Figure 11:
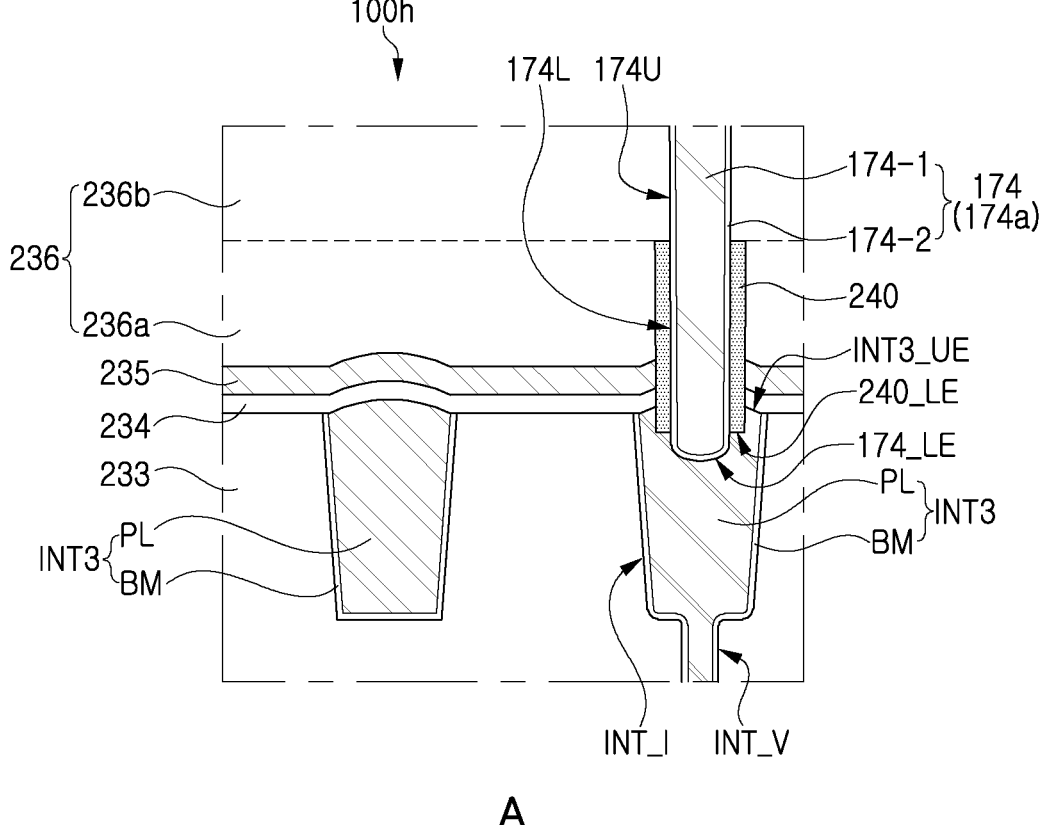
FIG. 11 is a schematic partially enlarged view of a semiconductor device according to example embodiments.

FIG. 11 is a schematic partially enlarged view of a semiconductor device 100h according to example embodiments. FIG. 11 is a partially enlarged view corresponding to region 'A' of FIG. 1A.

Referring to FIG. 11, at least a portion of the upper surface of the upper connection pattern INT3 may have a convex shape. Also, the fourth insulating layer 234 and the capping layer 235 may have a similar convex shape on the convex shape of the upper connection pattern INT3. That is, the fourth insulating layer 234 and the capping layer 235 may be conformally formed along the upper surface of the upper connection pattern INT3.

By forming the upper surface of the upper connection pattern INT3 in a convex shape, an overall volume of the upper connection pattern INT3 may be increased, thereby improving resistance characteristics.

Figure 12:
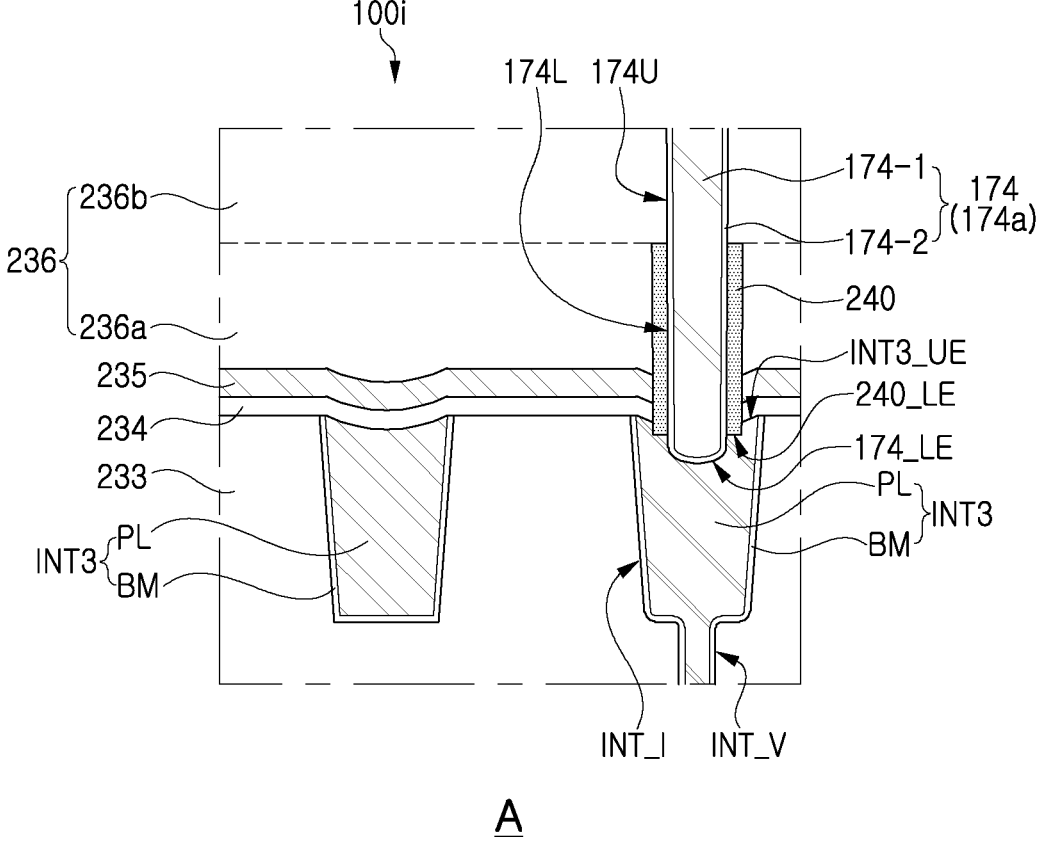
FIG. 12 is a schematic partially enlarged view of a semiconductor device according to example embodiments.

FIG. 12 is a schematic partially enlarged view of a semiconductor device 100i according to example embodiments. FIG. 12 is a partially enlarged view corresponding to region 'A' of FIG. 1A.

Referring to FIG. 12, at least a portion of the upper surface of the upper connection pattern INT3 may have a concave shape. Also, the fourth insulating layer 234 and the capping layer 235 may have a similar concave shape on the concave shape of the upper connection pattern INT3. That is, the fourth insulating layer 234 and the capping layer 235 may be conformally formed along the upper surface of the upper connection pattern INT3.

By forming the upper surface of the upper connection pattern INT3 in a concave shape, a bridge defect, such as a leakage current between adjacent upper connection patterns INT3, may be improved.

FIGS. 13A through 17 are a schematic cross-sectional view and partially enlarged views illustrating a method of manufacturing the semiconductor device 100 according to example embodiments. FIGS. 13B through 17 are enlarged views of a region corresponding to region 'C' of FIG. 13A.

Figure 13A:
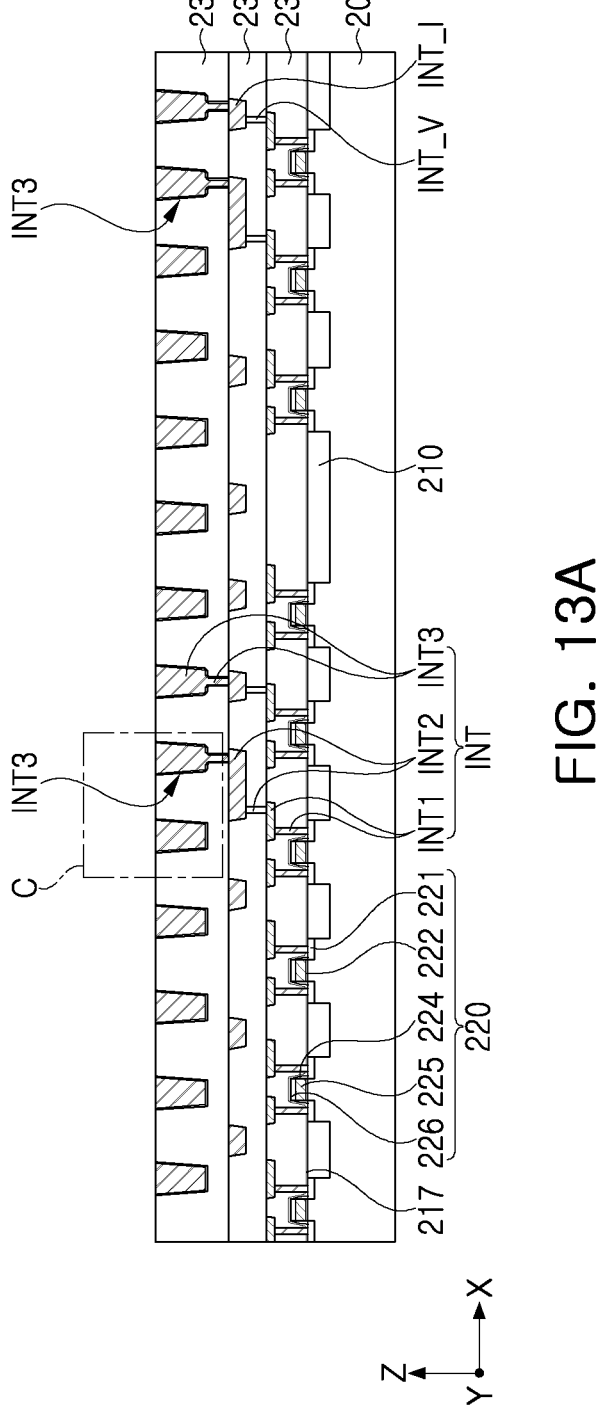
FIGS. 13A through 17 are schematic cross-sectional views and partially enlarged views illustrating a method of manufacturing a semiconductor device according to example embodiments.
Figure 13B:
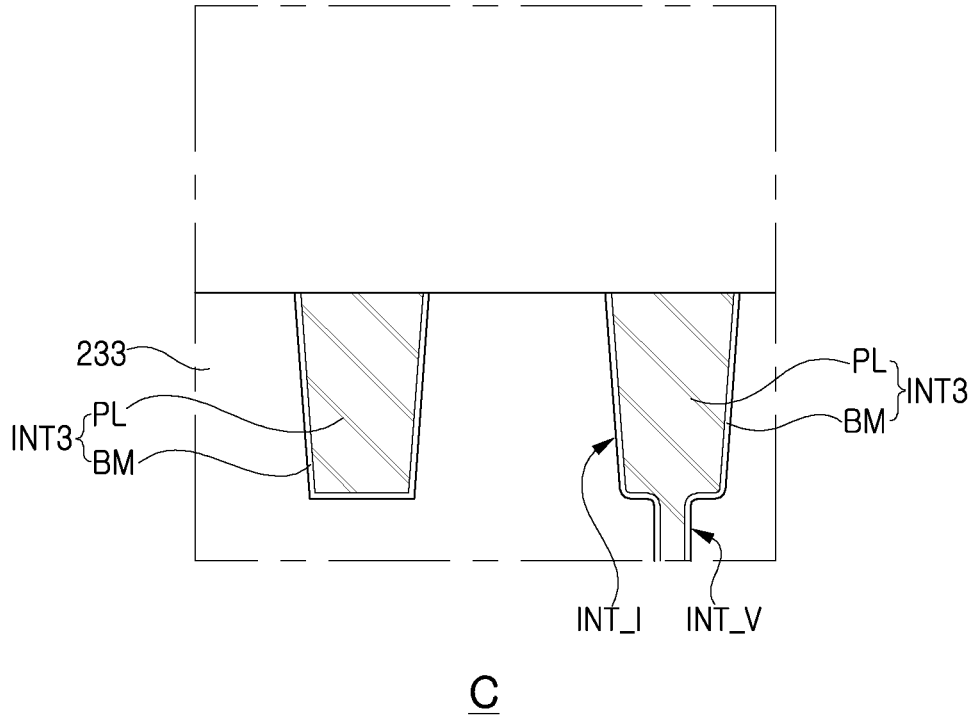

Referring to FIGS. 13A and 13B, the circuit elements 220 may be formed on the first substrate 201, and the first to third insulating layers 231, 232, and 233, which are on and at least partially covering the circuit elements 220 and the circuit wiring structure INT, may be formed.

First, the device separation layers 210 defining an active region may be formed in the first substrate 201, and the circuit gate dielectric layer 222, the circuit gate electrode 225, and the circuit gate capping layer 226 may be sequentially formed on the first substrate 201. The device separation layers 210 may be formed by, for example, a shallow trench isolation (STI) process. The circuit gate dielectric layer 222, the circuit gate electrode 225, and the circuit gate capping layer 226 may be formed using atomic layer deposition (ALD) or chemical vapor deposition (CVD). The circuit gate dielectric layer 222 may be formed of silicon oxide, the circuit gate electrode 225 may be formed of polycrystalline silicon and/or a metal silicide layer, and the circuit gate capping layer 226 may be formed of silicon nitride, but embodiments of the inventive concept are not limited thereto. Next, the spacer layers 224 may be formed on both sidewalls of the circuit gate dielectric layer 222 and/or the circuit gate electrode 225. In some embodiments, the spacer layer 224 may include a plurality of layers. Next, an ion implantation process may be performed to form the source/drain regions 205 to form the respective circuit elements 220.

Next, the insulating liner 217 on and at least partially covering the circuit elements 220 may be formed on the first substrate 201. The insulating liner 217 may have a substantially uniform thickness and may be conformally formed.

Next, the first insulating layer 231 and the lower connection patterns INT1 embedded in the first insulating layer 231 and having an upper surface coplanar with the upper surface of the first insulating layer 231 may be formed on the insulating liner 217. The lower connection patterns INT1 may be electrically connected to the circuit elements 220.

Next, the second insulating layer 232 and the intermediate connection patterns INT2 embedded in the second insulating layer 232 and having an upper surface coplanar with an upper surface of the second insulating layer 232 may be formed on the first insulating layer 231 and the lower connection patterns INT1. The intermediate connection patterns INT2 may be electrically connected to the lower connection patterns INT1.

Next, the third insulating layer 233 and the upper connection patterns INT3 embedded in the third insulating layer 233 and having an upper surface coplanar with the upper surface of the third insulating layer 233 may be formed on the second insulating layer 232 and the intermediate connection patterns INT2. In the upper connection patterns INT3, an opening passing through a portion of the third insulating layer 233 may be formed by performing an etching process, and the conductive barrier layer BM and the metal material pattern PL may be sequentially formed in the opening by performing a deposition process. The conductive barrier layer BM and the metal material pattern PL are formed by forming a barrier material and a metal material in the opening and on the third insulating layer 233 using an atomic layer deposition (ALD) or chemical vapor deposition (CVD) process and then removing the barrier material and the metal material formed on the third insulating layer 233 by performing a chemical mechanical polishing (CMP) process. Accordingly, the upper surface of the third insulating layer 233 and the upper surface of the upper connection patterns INT3 may be positioned at substantially the same level.

In this operation, due to a difference in the polishing degree of the third insulating layer 233 and the upper connection patterns INT3 in the CMP process, the upper surfaces of the upper connection patterns INT3 may have a convex or concave shape. Accordingly, a semiconductor device 100h of FIG. 11 or a semiconductor device 100i of FIG. 12 may be provided.

The upper connection patterns INT3 may include a wiring portion INT_I and a via portion INT_V extending downward in the Z direction from a portion of the wiring portion INT_I. In an example embodiment, the upper connection patterns INT3 may be formed by forming an opening by simultaneously etching regions corresponding to the wiring portion INT_I and the via portion INT_V and depositing the barrier material and the metal material. However, in some embodiments, the upper connection patterns INT3 may also be formed by forming an opening by etching the region corresponding to the via portion INT_V, depositing the barrier material and the metal material, forming an opening by etching the region corresponding to the wiring portion INT_I, and then depositing the barrier material and the metal material.

The third insulating layer 233 may be on and at least partially cover side surfaces of the upper connection patterns INT3. The upper connection patterns INT3 may be electrically connected to the intermediate connection patterns INT3. Accordingly, the circuit wiring structure INT electrically connected to the circuit elements 220, while passing through the first to third insulating layers 231, 232, and 233, may be formed. The circuit wiring structure INT may include lower connection patterns INT1, intermediate connection patterns INT2, and upper connection patterns INT3. In an example embodiment, the first to third insulating layers 231, 232, and 233 may include an insulating material, for example, silicon oxide.

Figure 14:
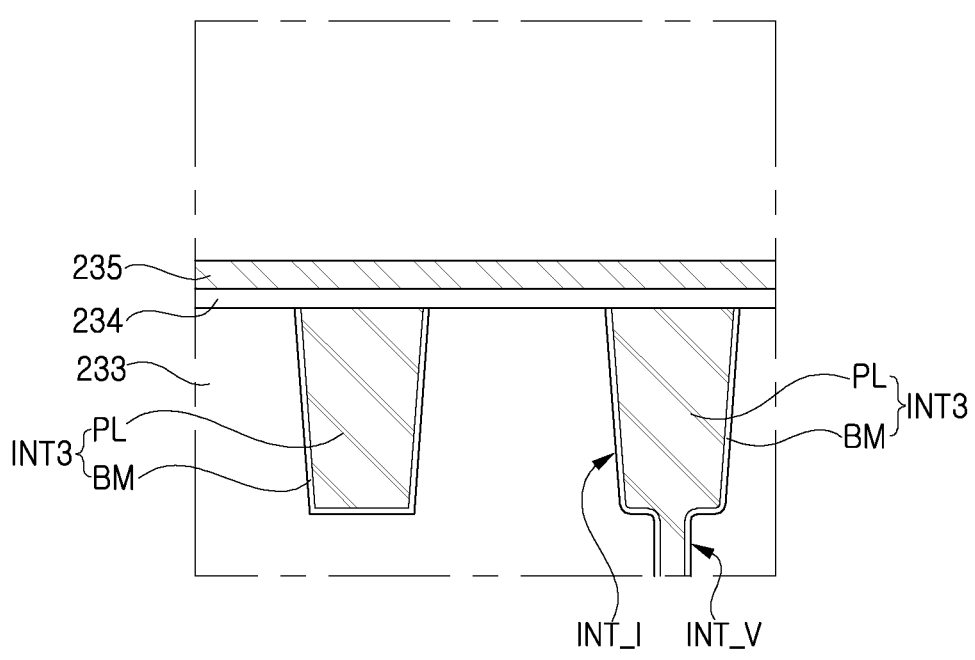

Referring to FIG. 14, the fourth insulating layer 234 and the capping layer 235 may be formed on the circuit wiring structure INT.

The fourth insulating layer 234 may be formed on the third insulating layer 233 and the upper connection patterns INT3 through a deposition process, for example, an atomic layer deposition (ALD) or chemical vapor deposition (CVD) process. The fourth insulating layer 234 may be conformally formed on and at least partially cover the upper surface of the third insulating layer 233 and the upper surface of the upper connection patterns INT3. The fourth insulating layer 234 may include an insulating material, for example, silicon oxide.

The capping layer 235 may be formed on the fourth insulating layer 234 through a deposition process, for example, an atomic layer deposition (ALD) or chemical vapor deposition (CVD) process. The capping layer 235 may be conformally formed on and at least partially cover the upper surface of the fourth insulating layer 234. The capping layer 235 may include an insulating material, for example, silicon nitride or a nitride-based material.

In the deposition process of the capping layer 235, a residual material in the upper connection patterns INT3 may be spread to cause a bridge defect, such as a leakage current occurring between adjacent upper connection patterns INT3. However, as the fourth insulating layer 234 is formed as an intermediate insulating layer between the capping layer 235 and the upper connection patterns INT3 to protect the upper connection patterns INT3, spread of the residual material inside the upper connection patterns INT3 may be reduced or prevented and the bridge defect problem may be improved.

The fourth insulating layer 234 and the capping layer 235 may have an optimal thickness to reduce the likelihood of or prevent the bridge defect problem, and for example, the fourth insulating layer 234 may have a thickness thinner than the capping layer 235. In an example embodiment, the thickness of the fourth insulating layer 234 may be in the range of about 100 Å to about 300 Å, and the thickness of the capping layer 235 may be in the range of about 200 Å to about 400 Å.

Figure 15:
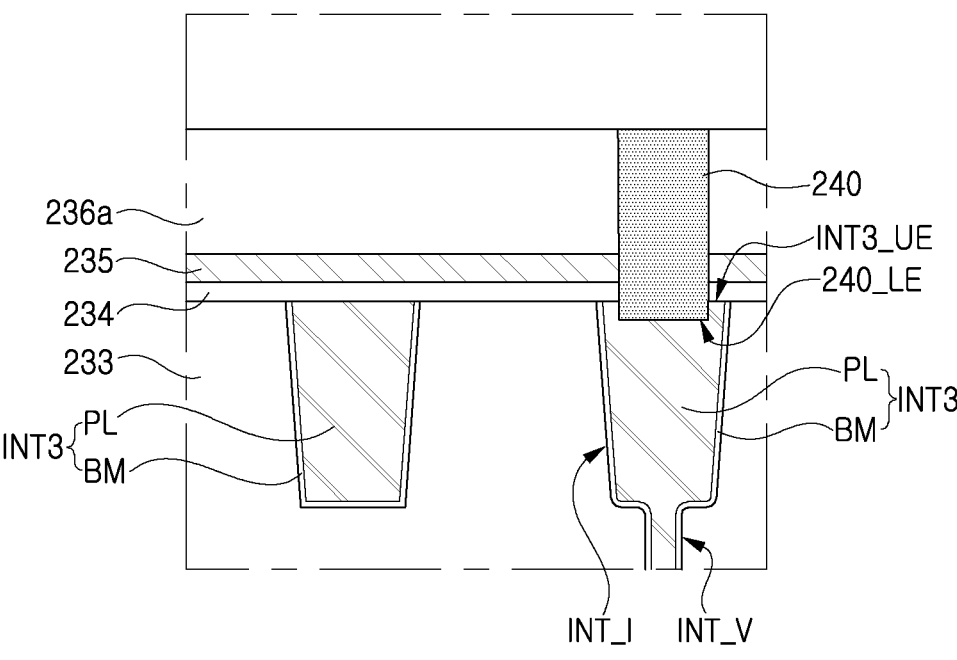
Figure 16:
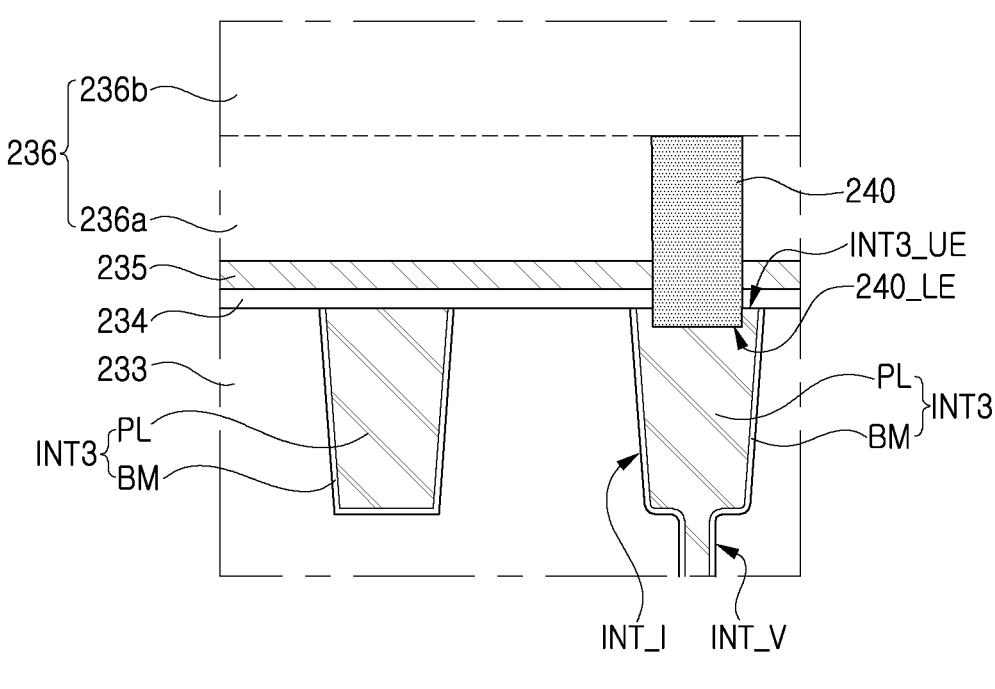
Figure 17:
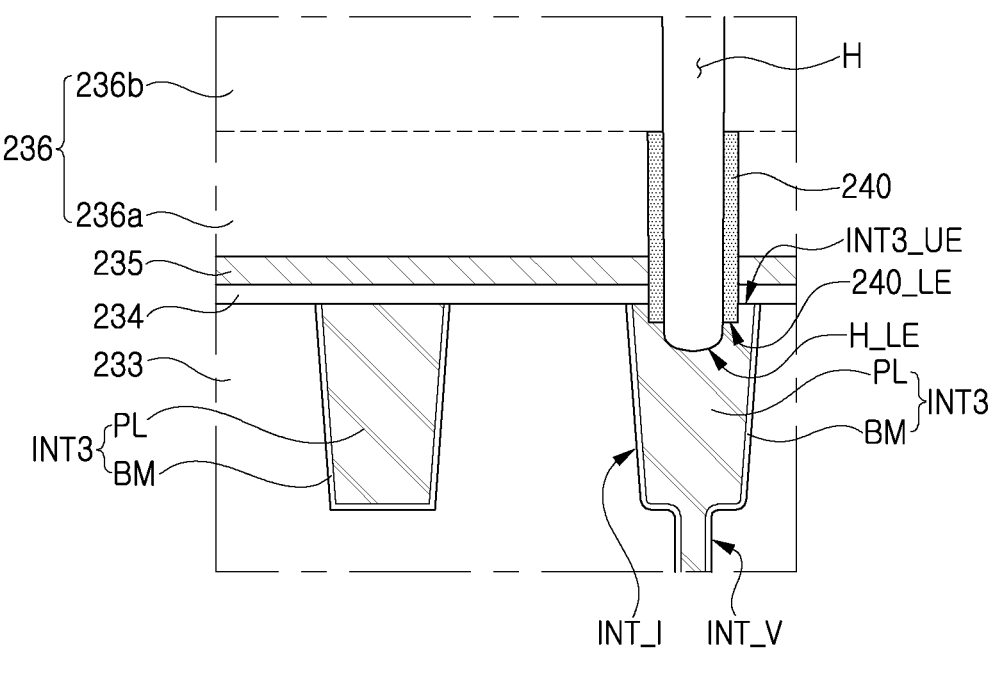

Referring to FIG. 15, a portion of the fifth insulating layer 236 may be formed on the capping layer 235, and the dam structure 240 in contact with the upper connection patterns INT3 may be formed.

After forming the fifth insulating layer 236 on the capping layer 235 to a predetermined thickness, an etching process may be performed to form an opening passing through the fifth insulating layer 236, the capping layer 235, and the fourth insulating layer 234. The opening may expose upper surfaces of the upper connection patterns INT3. In an example embodiment, the opening may be formed by etching a portion of the upper connection patterns INT3 together, but, in some embodiments, the upper connection patterns INT3 may not be etched, so that a lower surface of the opening and an upper surface of the upper connection patterns INT3 may be coplanar with each other.

Next, the dam structure 240 may be formed by at least partially filling the opening with a semiconductor material, such as silicon, a metal material, such as tungsten, or a nitride-based material and performing a chemical mechanical polishing (CMP) process.

In this operation, the etching rates of the fourth and fifth insulating layers 234 and 236 and the capping layer 235 may be different under the process conditions of the etching process. Due to the difference in the etching rate, the opening may have a convex shape toward the capping layer 235. In this case, the semiconductor device 100*c* of FIG. 6 may be provided by performing a subsequent process.

In this operation, the semiconductor device 100*e* of FIG. 8 may be provided by forming the opening to have a relatively large width.

In this operation, when referring to FIG. 14 together, without forming the capping layer 235, an opening passing through the fourth insulating layer 234 may be formed, at least partially filled with the above material, and then the capping layer 235 and the fifth insulating layer 236 may be formed, thereby providing the semiconductor device 100*f* of FIG. 9.

In this operation, without forming the fifth insulating layer 236, an opening passing through the capping layer 235 and the fourth insulating layer 234 may be formed and at least partially filled with the above material to provide the semiconductor device 100*g* of FIG. 10.

Referring to FIGS. 16 and 1A through 3, the fifth insulating layer 236 may be further formed to form the peripheral circuit structure PERI, and the second substrate 201, the stack structure GS, the capping insulating layers 181*a* and 181*b* on and at least partially covering the stack structure GS, and the first and second upper insulating layers 182 and 183 may be formed on the peripheral circuit structure PERI. In this operation, the channel structure CH and the separation structure MS may be formed together.

Referring to FIGS. 17 and 1A through 3, the capping insulating layers 181*a* and 181*b*, the fifth insulating layer 236, and the contact hole H passing through the dam structure 240 may be formed by performing an etching process, and thereafter, a cleaning process for removing a residual material or the like due to the etching process may be performed.

In the cleaning process, because the fourth insulating layer 234 is not exposed by the contact hole H, a semiconductor device in which a problem, such as a mold collapse phenomenon, is improved may be provided. The dam structure 240 may be a barrier structure separating the contact hole H from the fourth insulating layer 234 to reduce the likelihood of or prevent the fourth insulating layer 234 from being removed or melted in the cleaning process.

Next, referring to FIGS. 1A through 3, the contact hole H may be at least partially filled with a conductive material to form the through-contact plugs 174, and the third upper insulating layer 184 and the upper wiring structure including the wiring lines 192 and the wiring via 193 may be formed to provide a semiconductor device.

Figure 18:
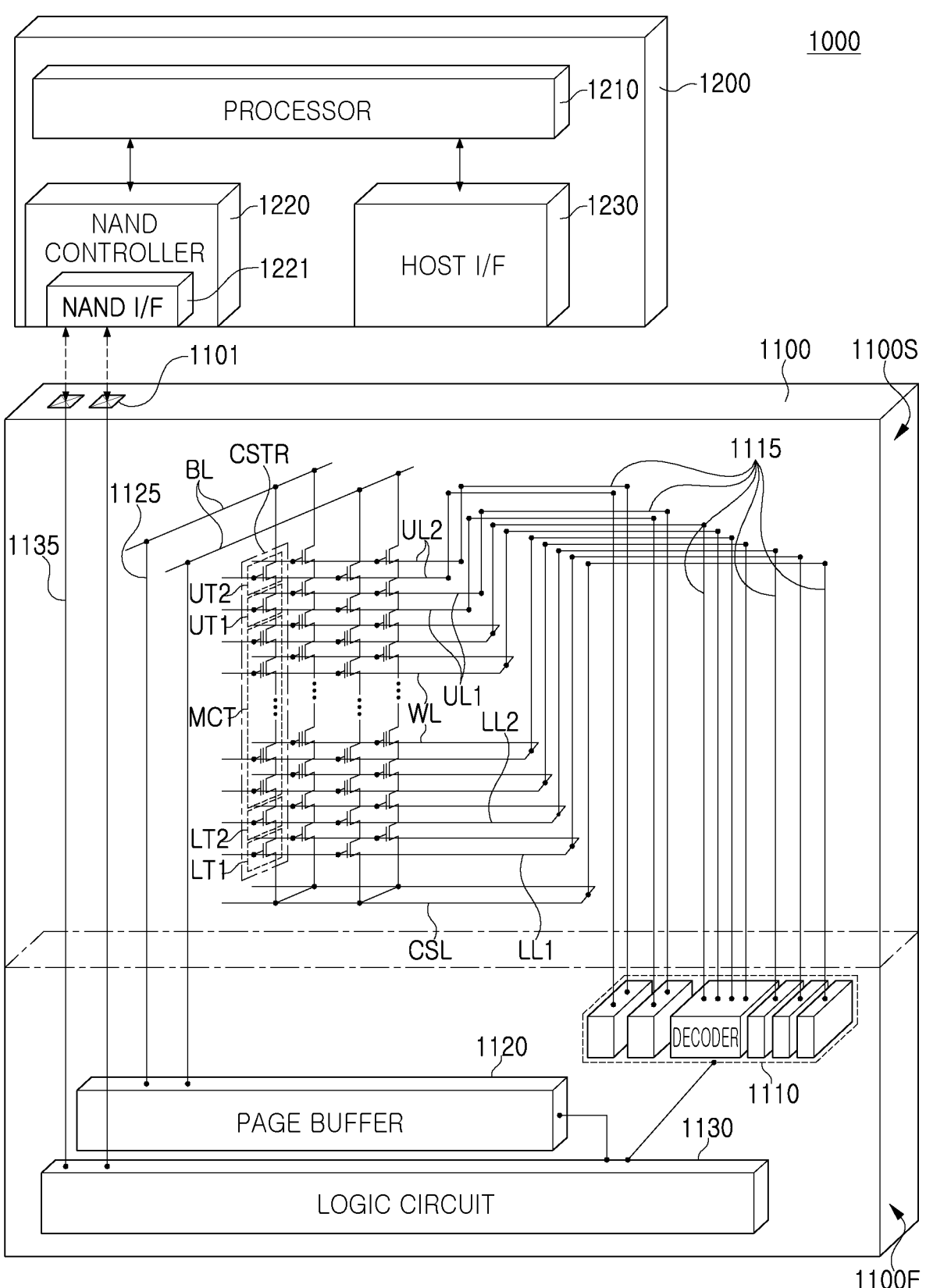
FIG. 18 is a diagram schematically illustrating a data storage system including a semiconductor device according to example embodiments.

FIG. 18 is a diagram schematically illustrating a data storage system including a semiconductor device according to example embodiments.

Referring to FIG. 18, a data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive device (SSD) including one or a plurality of semiconductor devices 1100, a universal serial bus (USB), a computing system, a medical device, or a communications device.

The semiconductor device 1100 may be a nonvolatile memory device, for example, a NAND flash memory device in accordance with any of the embodiments described above with reference to FIGS. 1 through 12. The semiconductor device 1100 may include a first structure 1100F and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously changed according to different embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection lines 1115 extending from the inside of the first structure 1100F to the second structure 1100S. The bit lines BL may be electrically connected to the page buffer 1120 through second connection lines 1125 extending from the inside of the first structure 1100F to the second structure 1100S.

In the first structure 1100F, the decoder circuit 1110 and the page buffer 1120 may be configured to perform a control operation on at least one selected memory cell transistor among the plurality of memory cell transistors MCT. The decoder circuit 1110 and the page buffer 1120 may be controlled by the logic circuit 1130. The semiconductor device 1000 may communicate with the controller 1200 through the input/output pad 1101 electrically connected to the logic circuit 1130. The input/output pad 1101 may be electrically connected to the logic circuit 1130 through an input/output connection line 1135 extending from the inside of the first structure 1100F to the second structure 1100S.

The controller 1200 may include a processor 1210, a NAND controller 1220, and a host interface (I/F) 1230. In some embodiments, the data storage system 1000 may include a plurality of semiconductor devices 1100, and in this case, the controller 1200 may control the plurality of semiconductor devices 1000.

The processor 1210 may be configured to control an overall operation of the data storage system 1000 including the controller 1200. The processor 1210 may operate according to instructions encoded in predetermined firmware, and may access the semiconductor device 1100 by controlling the NAND controller 1220. The NAND controller 1220 may include a NAND interface 1221 handling communication with the semiconductor device 1100. Through the NAND interface 1221, a control command for controlling the semiconductor device 1100, data to be written to the memory cell transistors MCT of the semiconductor device 1100, data to be read from the memory cell transistors MCT of the semiconductor device 1100, or the like, may be transmitted. The host I/F 1230 may provide a communication function between the data storage system 1000 and an external host. When receiving a control command from an external host through the host I/F 1230, the processor 1210 may control the semiconductor device 1100 in response to the control command.

Figure 19:
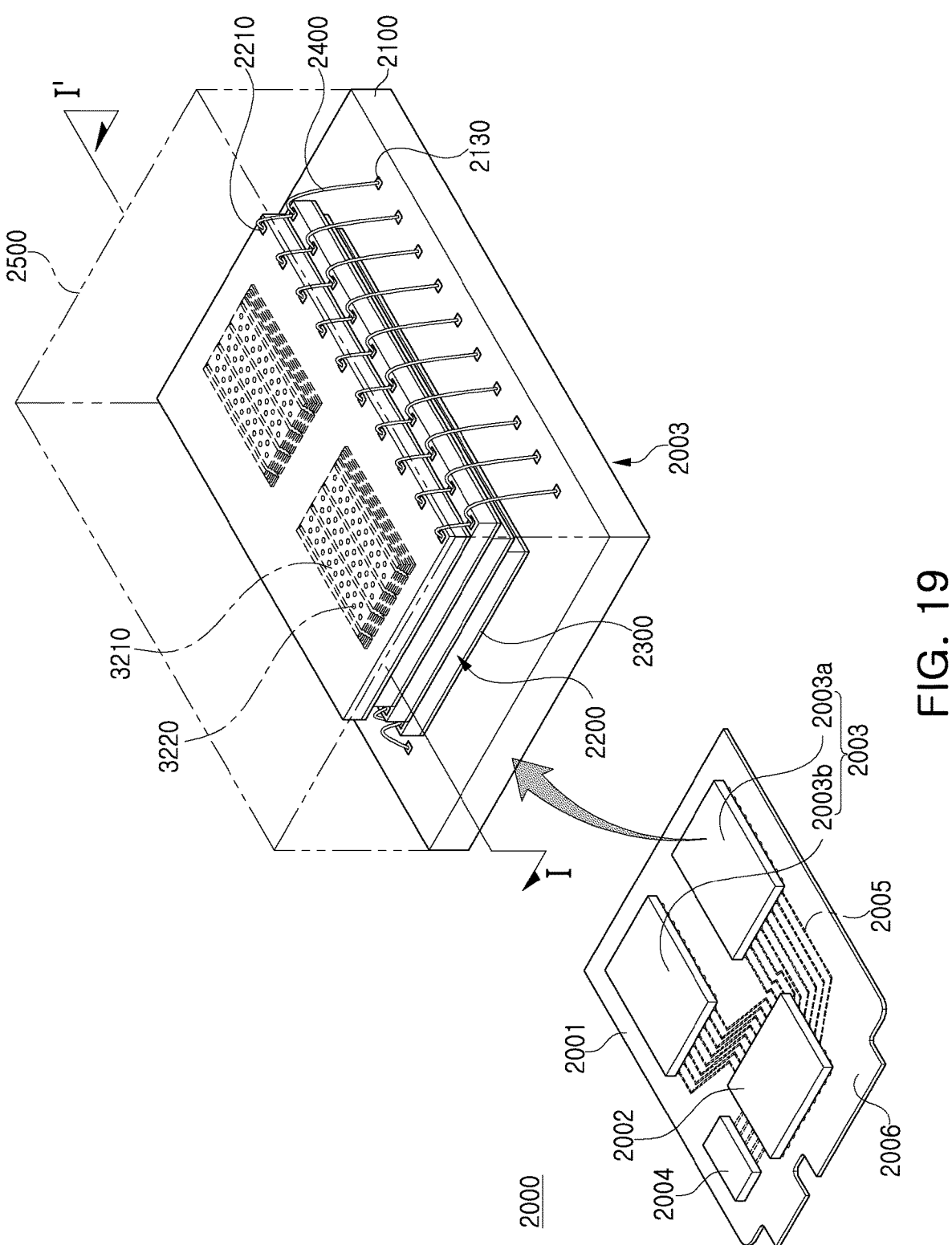
FIG. 19 is a schematic perspective view of a data storage system including a semiconductor device according to an example embodiment.

FIG. 19 is a schematic perspective view of a data storage system including a semiconductor device according to an example embodiment.

Referring to FIG. 19, a data storage system 2000 according to an example embodiment of the present inventive concept may include a main board 2001, a controller 2002 mounted on the main board 2001, one or more semiconductor packages 2003, and DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary based on a communication interface between the data storage system 2000 and the external host. In example embodiments, the data storage system 2000 may communicate with an external host according to any one of various example interfaces, such as universal serial bus (USB), peripheral component interconnect express (PCI-Express), serial advanced technology attachment (SATA), M-Phy for universal flash storage (UFS), etc. In example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may be configured to write data to or read data from the semiconductor package 2003, and may improve an operating speed of the data storage system 2000.

The DRAM 2004 may be a buffer memory for mitigating a speed difference between the semiconductor package 2003 as a data storage space and an external host. The DRAM 2004 included in the data storage system 2000 may operate as a kind of cache memory, and may provide a space for temporarily storing data in a control operation for the semiconductor package 2003. When the data storage system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, semiconductor chips 2200 on the package substrate 2100, and adhesive layers 2300 disposed on lower surfaces of the semiconductor chips 2200, respectively, a connection structure 2400 electrically connecting the semiconductor chips 2200 and the package substrate 2100, and a molding layer 2500 on and at least partially covering the semiconductor chips 2200 and the connection structure 2400 on the package substrate 2100.

The package substrate 2100 may be a PCB including package upper pads 2130. Each semiconductor chip 2200 may include an input/output pad 2210. The input/output pad 2210 may correspond to the input/output pad 1101 of FIG. 18. Each of the semiconductor chips 2200 may include gate stack structures 3210 and channel structures 3220. Each of the semiconductor chips 2200 may include the semiconductor device described above with reference to FIGS. 1 through 12.

In example embodiments, the connection structure 2400 may be a bonding wire electrically connecting the input/output pad 2210 and the package upper pads 2130. Accordingly, in each of the first and second semiconductor packages 2003a and 2003b, the semiconductor chips 2200 may be electrically connected to each other by a bonding wire method, and may be electrically connected to the package upper pads 2130 of the package substrate 2100. According to embodiments, in each of the first and second semiconductor packages 2003a and 2003b, the semiconductor chips 2200 may be electrically connected to each other by a connection structure including a through-electrode (through silicon via (TSV), instead of the bonding wire-type connection structure 2400.

In example embodiments, the controller 2002 and the semiconductor chips 2200 may be included in one package. In an example embodiment, the controller 2002 and the semiconductor chips 2200 may be mounted on a separate interposer substrate different from the main substrate 2001, and the controller 2002 and the semiconductor chips 2200 may be connected to each other by wiring formed on the interposer substrate.

Figure 20:
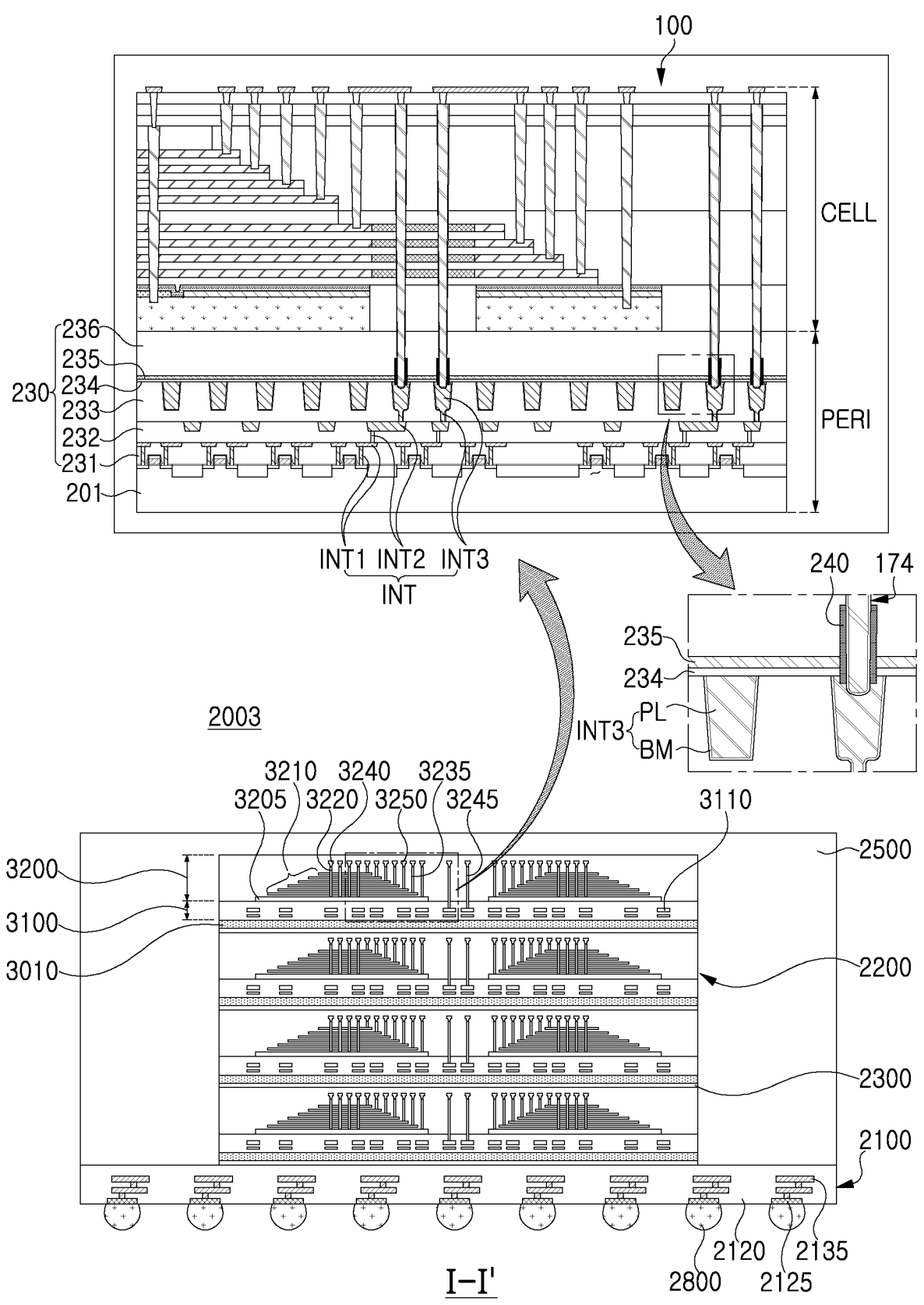
FIG. 20 is a cross-sectional view schematically illustrating a semiconductor package according to an example embodiment.

FIG. 20 is a cross-sectional view schematically illustrating a semiconductor package according to an example embodiment. FIG. 20 illustrates an example embodiment of the semiconductor package 2003 of FIG. 19 and conceptually illustrates a region of the semiconductor package 2003 of FIG. 19, taken along line I-I'.

Referring to FIG. 20, in the semiconductor package 2003, the package substrate 2100 may be a PCB. The package substrate 2100 may include a package substrate body portion 2120, package upper pads 2130 (refer to FIG. 19) disposed on an upper surface of the package substrate body portion 2120, lower pads 2125 disposed on a lower surface of the package substrate body portion 2120 or exposed through the lower surface, and internal wirings 2135 electrically connecting the upper pads 2130 and the lower pads 2125 inside the package substrate body portion 2120. The upper pads 2130 may be electrically connected to the connection structures 2400. The lower pads 2125 may be connected to the wiring patterns 2005 of the main board 2010 of the data storage system 2000 as illustrated in FIG. 19 through conductive connectors 2800.

Each of the semiconductor chips 2200 may include a semiconductor substrate 3010 and a first structure 3100 and a second structure 3200 that are sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 passing through the gate stack structure 3210 and separation regions, bit lines 3240 electrically connected to the memory channel structures 3220, and gate contact plugs 3235 electrically connected to the word lines WL (refer to FIG. 16) of the gate stack structure 3210. As described above with reference to FIGS. 1 through 10, in each of the semiconductor chips 2200, the dam structure 240 may contact the upper connection patterns INT3 through the fourth insulating layer 234, thereby separating the through-contact plugs 174 and the fourth insulating layer 234 from each other.

Each of the semiconductor chips 2200 may include a through-wiring 3245 electrically connected to the peripheral wirings 3110 of the first structure 3100 and extending into the second structure 3200. The through-wiring 3245 may be disposed outside the gate stack structure 3210, and may be further disposed to pass through the gate stack structure 3210. Each of the semiconductor chips 2200 may further include an input/output pad 2210 (refer to FIG. 19) electrically connected to the peripheral wirings 3110 of the first structure 3100.

By including the dam structure in contact with the upper connection pattern through the intermediate insulating layer between the upper connection pattern and the capping layer, problems such as bridge defects and mold collapse may be improved, and a semiconductor device having improved production yield and integration and a data storage system including the same may be provided.

What is claimed is:

1. A semiconductor device comprising:
a peripheral circuit structure including a substrate, a circuit element with at least a gate disposed on the substrate, a circuit wiring structure including connection patterns electrically connected to the circuit element on the substrate and having different height levels relative to the substrate associated therewith, respectively, and a peripheral insulating structure on the circuit element and the circuit wiring structure on the substrate;
a memory cell structure on the peripheral circuit structure, the memory cell structure including interlayer insulating layers and gate electrodes alternately stacked on each other, a channel structure passing through the gate electrodes, and an upper wiring electrically connected to the channel structure on the channel structure; and
a through-contact plug electrically connecting either at least one of the gate electrodes or the upper wiring to an upper connection pattern, which is in an uppermost position of the connection patterns relative to an upper surface of the substrate,
wherein the peripheral circuit structure further includes a dam structure on the upper connection pattern,
wherein the peripheral insulating structure includes a first insulating layer on the circuit element and on a side surface of the upper connection pattern, a second insulating layer on the first insulating layer, a capping layer on the second insulating layer, and a third insulating layer on the capping layer,
wherein the dam structure passes through at least the second insulating layer and contacts the upper connection pattern,
wherein the through-contact plug includes a lower portion passing through the dam structure and contacting the upper connection pattern and an upper portion on the lower portion,
wherein an upper end of the upper connection pattern is positioned on a level higher, relative to the upper surface of the substrate, than a lower end of the through-contact plug, and
wherein a lower end of the dam structure is positioned on a level higher, relative to the upper surface of the substrate, than the lower end of the through-contact plug.

2. The semiconductor device of claim 1, wherein the upper end of the upper connection pattern is positioned on a level higher, relative to the upper surface of the substrate, than the lower end of the dam structure.

3. The semiconductor device of claim 1, wherein
the upper connection pattern includes a metal material pattern and a conductive barrier layer on a side surface and a bottom surface of the metal material pattern, and
wherein the second insulating layer is on at least a portion of an upper surface of the metal material pattern and an upper surface of the conductive barrier layer.

4. The semiconductor device of claim 1, wherein the second insulating layer is spaced apart from the through-contact plug by the dam structure.

5. The semiconductor device of claim 1, wherein a width of the dam structure is less than a width of the upper connection pattern in a first horizontal direction parallel to the upper surface of the substrate.

6. The semiconductor device of claim 1, wherein
the capping layer includes a material different from that of the first to third insulating layers, and
wherein the dam structure includes a material different from that of the second insulating layer.

7. The semiconductor device of claim 1, wherein, in the dam structure, a width at a portion passing through the capping layer is greater than a width at a region adjacent to the portion passing through the capping layer.

8. The semiconductor device of claim 7, wherein the through-contact plug has a planar side surface at a portion passing through the dam structure.

9. The semiconductor device of claim 1, wherein, in the through-contact plug, a width at a portion passing through the dam structure is greater than a width at a portion passing through the third insulating layer.

10. The semiconductor device of claim 1, wherein the upper end of the upper connection pattern is positioned on a level higher, relative to the upper surface of the substrate, than a lower end of a plug layer of the through-contact plug.

11. An semiconductor device comprising:

a peripheral circuit structure including a substrate, a circuit element with at least a gate disposed on the substrate, a circuit wiring structure including connection patterns electrically connected to the circuit element on the substrate and having different height levels relative to the substrate associated therewith, respectively, and a peripheral insulating structure on the circuit element and the circuit wiring structure on the substrate;

a memory cell structure on the peripheral circuit structure, the memory cell structure including interlayer insulating layers and gate electrodes alternately stacked on each other, a channel structure passing through the gate electrodes, and an upper wiring electrically connected to the channel structure on the channel structure; and a through-contact plug electrically connecting either at least one of the gate electrodes or the upper wiring to an upper connection pattern, which is in an uppermost position of the connection patterns relative to an upper surface of the substrate, wherein the peripheral circuit structure further includes a dam structure on the upper connection pattern, wherein the peripheral insulating structure includes a first insulating layer on the circuit element and on a side surface of the upper connection pattern, a second insulating layer on the first insulating layer, a capping layer on the second insulating layer, and a third insulating layer on the capping layer, wherein the dam structure passes through at least the second insulating layer and contacts the upper connection pattern, wherein the through-contact plug includes a lower portion passing through the dam structure and contacting the upper connection pattern and an upper portion on the lower portion, wherein the dam structure extends upwardly, away from the substrate, from a portion passing through the second insulating layer and passes through the capping layer, and wherein the capping layer is spaced apart from the through-contact plug by the dam structure.

12. The semiconductor device of claim 11, wherein the dam structure extends upwardly, away from the substrate, from a portion passing through the capping layer and passes through at least a portion of the third insulating layer, and wherein an upper end of the dam structure is on a level lower, relative to the upper surface of the substrate, than that of the memory cell structure.

13. A semiconductor device comprising:

a peripheral circuit structure including a substrate, a circuit element with at least a gate disposed on the substrate, a circuit wiring structure including connection patterns electrically connected to the circuit element on the substrate and having different height levels relative to the substrate associated therewith, respectively, and a peripheral insulating structure on the circuit element and the circuit wiring structure on the substrate;

a memory cell structure on the peripheral circuit structure, the memory cell structure including interlayer insulating layers and gate electrodes alternately stacked on each other, a channel structure passing through the gate electrodes, and an upper wiring electrically connected to the channel structure on the channel structure; and a through-contact plug electrically connecting an upper connection pattern, which is in an uppermost position of the connection patterns relative to an upper surface of the substrate, to either the upper wiring or the gate electrodes, wherein the peripheral insulating structure includes a capping layer on the upper connection pattern and an intermediate insulating layer between the capping layer and the upper connection pattern, wherein the peripheral circuit structure further includes a dam structure passing through at least the intermediate insulating layer, bordering a portion of a side surface of the through-contact plug, and including a material different from a material of the intermediate insulating layer, wherein the capping layer includes an insulating material different from the material of the intermediate insulating layer, wherein an upper end of the upper connection pattern is positioned on a level higher, relative to the upper surface of the substrate, than a lower end of the through-contact plug, and wherein a lower end of the dam structure is positioned on a level higher, relative to the upper surface of the substrate, than the lower end of the through-contact plug.

14. The semiconductor device of claim 13, wherein the intermediate insulating layer includes silicon oxide, wherein the capping layer includes silicon nitride, silicon oxynitride, or another nitride-based material, and wherein the dam structure includes silicon nitride, a semiconductor material, or a metal material.

15. The semiconductor device of claim 13, wherein the through-contact plug passes through the dam structure and contacts the upper connection pattern, and wherein the dam structure separates the through-contact plug from the intermediate insulating layer.

16. The semiconductor device of claim 13, wherein the dam structure includes a first portion bordered by the intermediate insulating layer and a second portion bordered by the capping layer, wherein a lower surface of the dam structure is in contact with the upper connection pattern, and wherein an upper surface of the dam structure is positioned on a level lower than an upper surface of the peripheral circuit structure relative to the upper surface of the substrate.

17. The semiconductor device of claim 16, wherein the second portion of the dam structure has a side convexly protruding in a direction toward the capping layer.

18. The semiconductor device of claim 13, wherein the memory cell structure includes a source structure on the peripheral circuit structure;

wherein the gate electrodes are on the source structure; and wherein the channel structure includes a channel layer connected to the source structure.

19. A data storage system comprising: the semiconductor device of claim 1, further comprising an input/output pad electrically connected to the circuit element; and a controller electrically connected to the semiconductor device through the input/output pad and configured to control the semiconductor device.

20. The data storage system of claim 19, wherein
the dam structure extends into the upper connection
 pattern through the capping layer and the second insu-
 lating layer,
and
wherein a first level of a lower end of the dam structure
 is higher than a second level of a lower end of the
 through-contact plug relative to the upper surface of the
 substrate.

* * * * *